(12) United States Patent
Oh et al.

(10) Patent No.: US 10,446,216 B2
(45) Date of Patent: Oct. 15, 2019

(54) EMBEDDED REFRESH CONTROLLERS AND MEMORY DEVICES INCLUDING THE SAME

(71) Applicant: Samsung Electronics Co., Ltd., Suwon-si, Gyeonggi-do (KR)

(72) Inventors: Jong-Min Oh, Seoul (KR); Ho-Young Song, Hwaseong-si (KR); Do-Yeon Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 146 days.

(21) Appl. No.: 15/134,637

(22) Filed: Apr. 21, 2016

(65) Prior Publication Data

US 2017/0011792 A1 Jan. 12, 2017

Related U.S. Application Data

(60) Provisional application No. 62/188,960, filed on Jul. 6, 2015.

(30) Foreign Application Priority Data

Aug. 25, 2015 (KR) ........................ 10-2015-0119402

(51) Int. Cl.
*G11C 11/406* (2006.01)
*G11C 11/4072* (2006.01)
(Continued)

(52) U.S. Cl.
CPC ...... *G11C 11/40622* (2013.01); *G11C 11/406* (2013.01); *G11C 11/408* (2013.01);
(Continued)

(58) Field of Classification Search
CPC ........... G11C 11/40622; G11C 11/406; G11C 11/408; G11C 11/4072; G11C 11/4076; G11C 11/40618
See application file for complete search history.

(56) References Cited

U.S. PATENT DOCUMENTS

2005/0041502 A1 2/2005 Perner
2006/0085616 A1 4/2006 Zeighami et al.
(Continued)

FOREIGN PATENT DOCUMENTS

| KR | 2015-0002783 | 1/2015 |
| KR | 2015-0058366 | 5/2015 |
| WO | WO 2015/030751 | 3/2015 |

*Primary Examiner* — Masud K Khan
(74) *Attorney, Agent, or Firm* — Myers Bigel, P.A.

(57) ABSTRACT

Embedded refresh controllers included in memory devices and memory devices including the embedded refresh controllers are provided. The embedded refresh controllers may include a refresh counter and an address generator. The refresh counter may generate a counter refresh address signal in response to a counter refresh signal such that the counter refresh address signal may represent a sequentially changing address. The address generator may store information with respect to a hammer address that is accessed intensively and may generates a hammer refresh address signal in response to a hammer refresh signal such that the hammer refresh address signal may represent an address of a row that is physically adjacent to a row of the hammer address. Loss of cell data may be reduced and performance of the memory device may be enhanced by detecting the intensively-accessed hammer address and performing the refresh operation based on the detected hammer address efficiently.

18 Claims, 24 Drawing Sheets

(51) Int. Cl.
  *G11C 11/408* (2006.01)
  *G11C 11/4076* (2006.01)
(52) U.S. Cl.
  CPC ...... *G11C 11/4072* (2013.01); *G11C 11/4076* (2013.01); *G11C 11/40618* (2013.01)

(56) References Cited

U.S. PATENT DOCUMENTS

| | | |
|---|---|---|
| 2007/0171751 A1 | 7/2007 | Ho |
| 2009/0013127 A1 | 1/2009 | Atkinson et al. |
| 2011/0228864 A1* | 9/2011 | Aryanfar ............ H04L 25/0272 375/259 |
| 2012/0250388 A1 | 10/2012 | Jeddeloh |
| 2014/0006703 A1 | 1/2014 | Bains et al. |
| 2014/0059287 A1 | 2/2014 | Bains et al. |
| 2014/0156923 A1 | 6/2014 | Bains et al. |
| 2015/0058549 A1 | 2/2015 | Jeffrey et al. |
| 2015/0085564 A1* | 3/2015 | Yoon ................ G11C 11/40611 365/149 |
| 2015/0089326 A1 | 3/2015 | Joo et al. |
| 2015/0109871 A1 | 4/2015 | Bains et al. |
| 2015/0162067 A1 | 6/2015 | Kim et al. |
| 2015/0162071 A1 | 6/2015 | Yoon et al. |
| 2015/0220485 A1* | 8/2015 | Dvoretzki ............ G06F 3/0689 711/114 |

\* cited by examiner

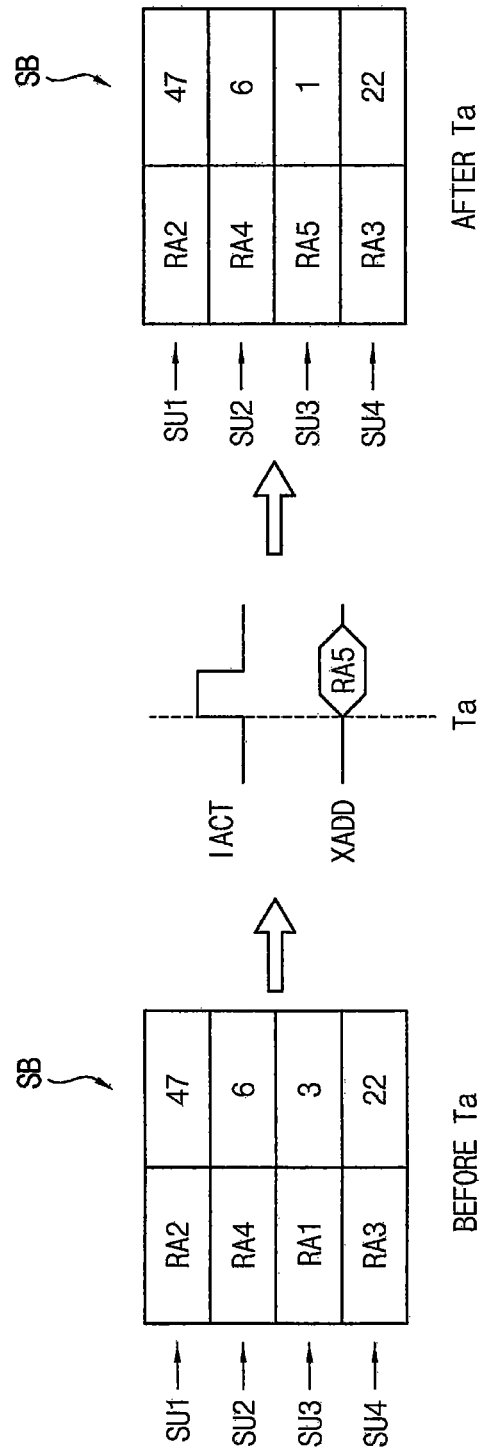

EMBEDDED REFRESH CONTROLLERS AND MEMORY DEVICES INCLUDING THE SAME

CROSS-REFERENCE TO RELATED APPLICATIONS

This U.S. Non-provisional application claims priority under 35 U.S.C § 119 to U.S. Provisional Application No. 62/188,960 filed on Jul. 6, 2015 in the United States Patent and Trademark Office (USPTO) and Korean Patent Application No. 10-2015-0119402 filed on Aug. 25, 2015 in the Korean Intellectual Property Office (KIPO), the disclosures of all of which are hereby incorporated by reference in their entireties.

BACKGROUND

Example embodiments of the present inventive concept relate generally to integrated circuit devices and, more particularly, to embedded refresh controllers and memory devices including the embedded refresh controllers.

Semiconductor memory devices for storing data may be classified into volatile memory devices and non-volatile memory devices. Volatile memory devices, such as dynamic random access memory (DRAM) devices, may be configured to store data by charging or discharging capacitors in memory cells, and lose the stored data when power is off. Non-volatile memory devices, such as flash memory devices, may maintain stored data even when power is off. Volatile memory devices are widely used as main memories of various apparatuses, and non-volatile memory devices are widely used for storing program code and/or data in various electronic devices, such as computers, mobile devices, etc.

In volatile memory devices, cell charges stored in a memory cell may be lost by a leakage current. In addition, when a wordline is transitioned frequently between an active state and a precharged state (i.e., when the wordline has been accessed intensively or frequently), an affected memory cell connected to a wordline that is adjacent to the wordline frequently accessed may lose stored charges. Charges stored in a memory cell may be recharged before data is lost by leakage of cell charges. Such recharge of cell charges is referred to as a refresh operation, and a refresh operation may be performed repeatedly before cell charges are significantly lost.

SUMMARY

Example embodiments of the present inventive concept may provide an embedded refresh controller capable of detecting a hammer address that has been accessed intensively and performing a refresh operation efficiently.

Example embodiments of the present inventive concept may provide a memory device including an embedded refresh controller capable of detecting a hammer address that has been accessed intensively and performing a refresh operation efficiently.

An embedded refresh controller included in a memory device may include a refresh counter configured to generate a counter refresh address signal in response to a counter refresh signal. The counter refresh address signal may correspond to a row address of the memory device. The embedded refresh controller may also include an address generator configured to store information with respect to a hammer address that is accessed intensively and configured to generate a hammer refresh address signal in response to a hammer refresh signal. The hammer refresh address signal may correspond to an address of a first row of the memory device that is physically adjacent to a second row of the memory device corresponding to the hammer address.

In various embodiments, the address generator may include a storage circuit configured to store row addresses of the memory device and respective access count values corresponding to the row addresses in response to an active signal and an address signal provided from a memory controller. Each of the access count values may represent a number of occurrence of access to a respective row among a plurality of rows of the memory device.

According to various embodiments, the address generator may be configured to accumulate the access count values without initializing the access count values stored in the storage circuit in each of a plurality of time frames.

According to various embodiments, the address generator may be configured to determine the hammer address as an address of one of the plurality of rows having a highest access count value among the access count values stored in the storage circuit when the hammer refresh signal is activated.

In various embodiments, the address generator may be configured to initialize the highest access count value to zero without changing remaining access count values after determining the hammer address.

According to various embodiments, the address generator may be configured to initialize the highest access count value and a lowest access count value among the access count values stored in the storage circuit to zero without changing remaining access count values after determining the hammer address.

In various embodiments, the storage circuit may include a plurality of storage units, and each of the storage units may be configured to store a respective one of the row addresses and a respective one of the access count values.

According to various embodiments, the address generator may be configured to replace an address of a new row with an address of one of the plurality of rows corresponding to a lowest access count value among the access count values stored in the storage circuit when all of the storage units store the row addresses and the new row that corresponds to the address not stored in the storage units is accessed.

In various embodiments, the address generator may includes a storage circuit configured to store the information with respect to the hammer address, a storage control circuit configured to control the storage circuit in response to the hammer refresh signal, an active signal and an address signal provided from a memory controller and configured to provide the hammer address based on the information stored in the storage circuit and a mapping circuit configured to generate the hammer refresh address signal in response to the hammer address.

According to various embodiments, the embedded refresh controller may further include a timing controller configured to generate the counter refresh signal and the hammer refresh signal in response to a refresh signal provided from a memory controller.

In various embodiments, the timing controller may be configured to selectively activate one of the counter refresh signal and the hammer refresh signal.

A memory device may include a memory cell array including a plurality of memory cells and an embedded refresh controller configured to control a refresh operation of the memory cells. The embedded refresh controller may include a refresh counter configured to generate a counter refresh address signal in response to a counter refresh signal. The counter refresh address signal may correspond to a row address of the memory cell array. The embedded refresh controller may also include an address generator configured to store information with respect to a hammer address that is accessed intensively and configured to generate a hammer refresh address signal in response to a hammer refresh signal. The hammer refresh address signal may correspond to an address of a first row of the memory cell array that is physically adjacent to a second row of the memory cell array corresponding to the hammer address.

In various embodiments, the memory cell array may includes a plurality of memory banks, and the address generator may include a plurality of sub-generators. Each of the sub-generators may be configured to independently generate hammer refresh address signals corresponding to each of the memory banks.

According to various embodiments, first ones of the memory cells included in rows that have addresses corresponding to the counter refresh address signal may be configured to be refreshed simultaneously in all of the memory banks when the counter refresh signal is activated, and second ones of the memory cells included in rows that have addresses corresponding to the hammer refresh address signals of the respective memory banks may be configured to be refreshed simultaneously in all of the memory banks when the hammer refresh signal is activated.

In various embodiments, the memory device may be a three-dimensional memory device including a plurality of semiconductor dies that are stacked vertically.

A memory device may include a embedded refresh controller including an address generator that may be configured to store addresses of rows and numbers of occurrence of access to the respective rows and may be configured to determine a hammer address as the address of one of the rows that has a highest number of occurrence of access in response to a hammer refresh signal.

In various embodiments, the address generator may be configured to initialize the number of occurrence of access of the one of the rows that has the highest number of occurrence of access without changing at least one of the numbers of occurrence of access after determining the hammer address.

According to various embodiments, the address generator may be configured to initialize the address of the one of the rows that has the highest number of occurrence of access after determining the hammer address.

In various embodiments, the address generator may be configured to initialize the number of occurrence of access of one of the rows that has a lowest number of occurrence of access without changing remaining number of occurrence of access after determining the hammer address.

According to various embodiments, a memory cell array including the rows and the embedded refresh controller may be in one die.

BRIEF DESCRIPTION OF THE DRAWINGS

Example embodiments of the present inventive concept will be more clearly understood from the following detailed description taken in conjunction with the accompanying drawings.

FIGS. 5A, 5B, 5C and 5D are diagrams illustrating methods of counting access numbers according to example embodiments.

DETAILED DESCRIPTION OF THE EMBODIMENTS

Figure 1:
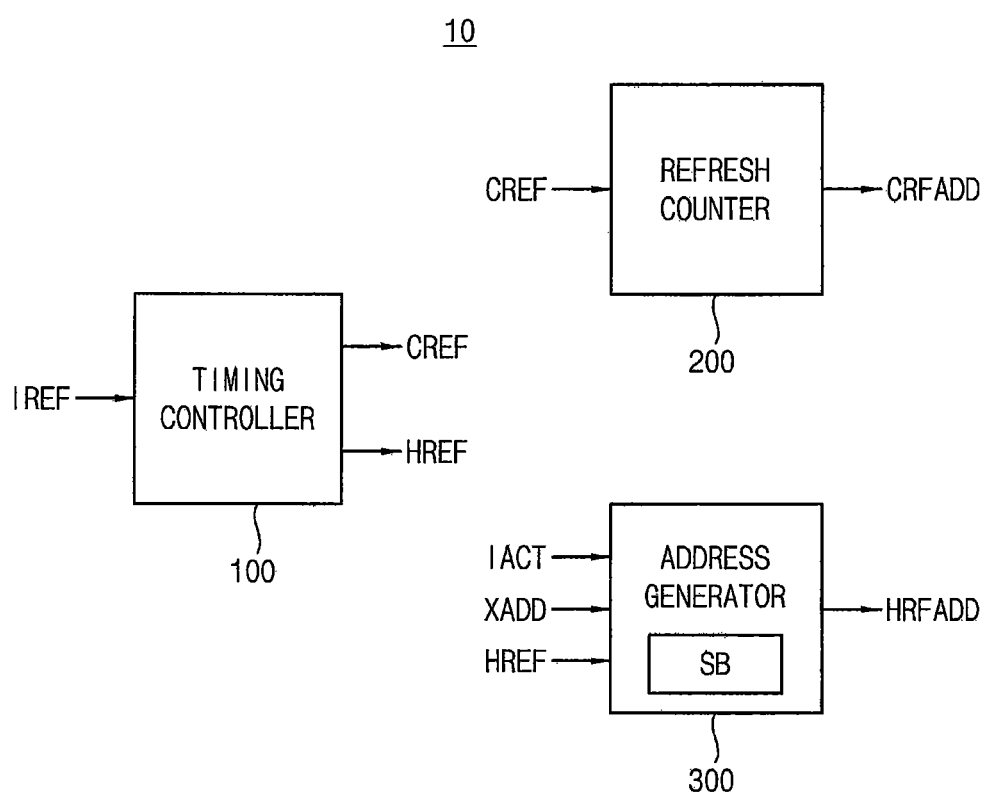
FIG. 1 is a block diagram illustrating an embedded refresh controller according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an embedded refresh controller according to example embodiments.

Referring to FIG. 1, an embedded refresh controller 10 may include a timing controller 100, a refresh counter 200 and an address generator 300.

Figure 9A:
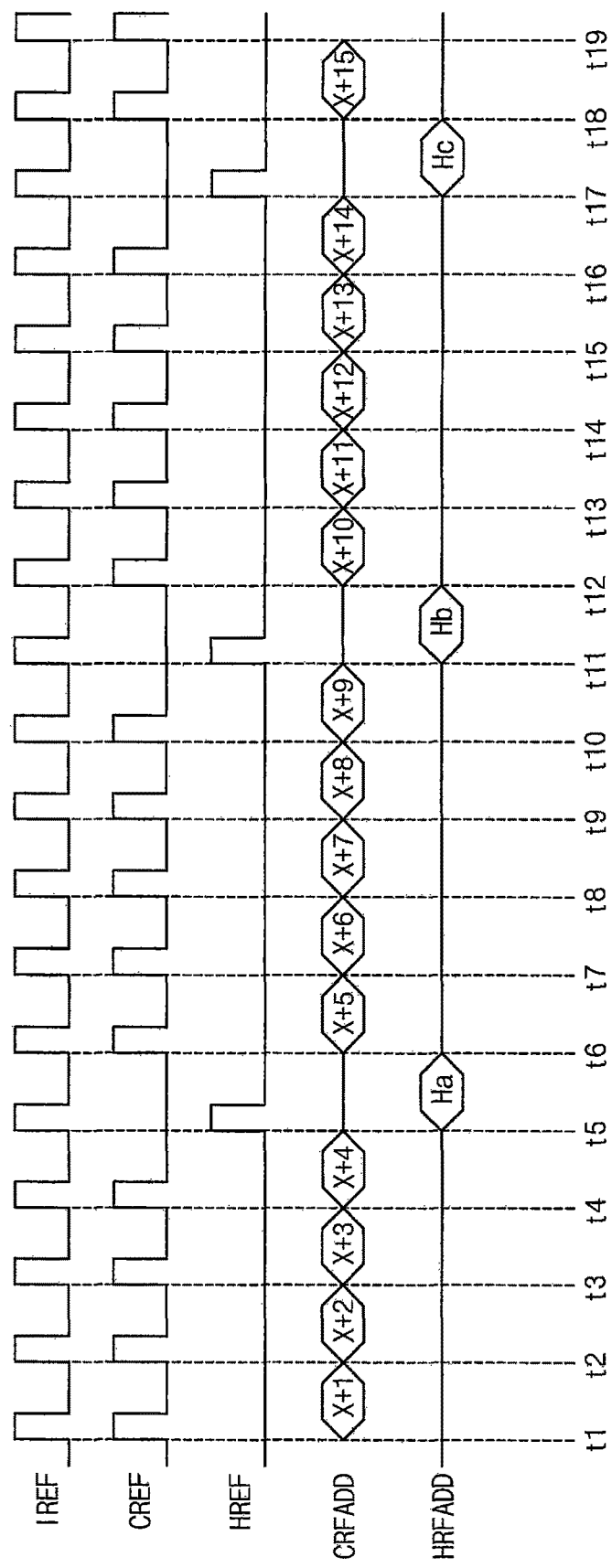
FIGS. 9A, 9B and 9C are timing diagrams illustrating operations of an embedded refresh controller according to example embodiments.
Figure 9B:
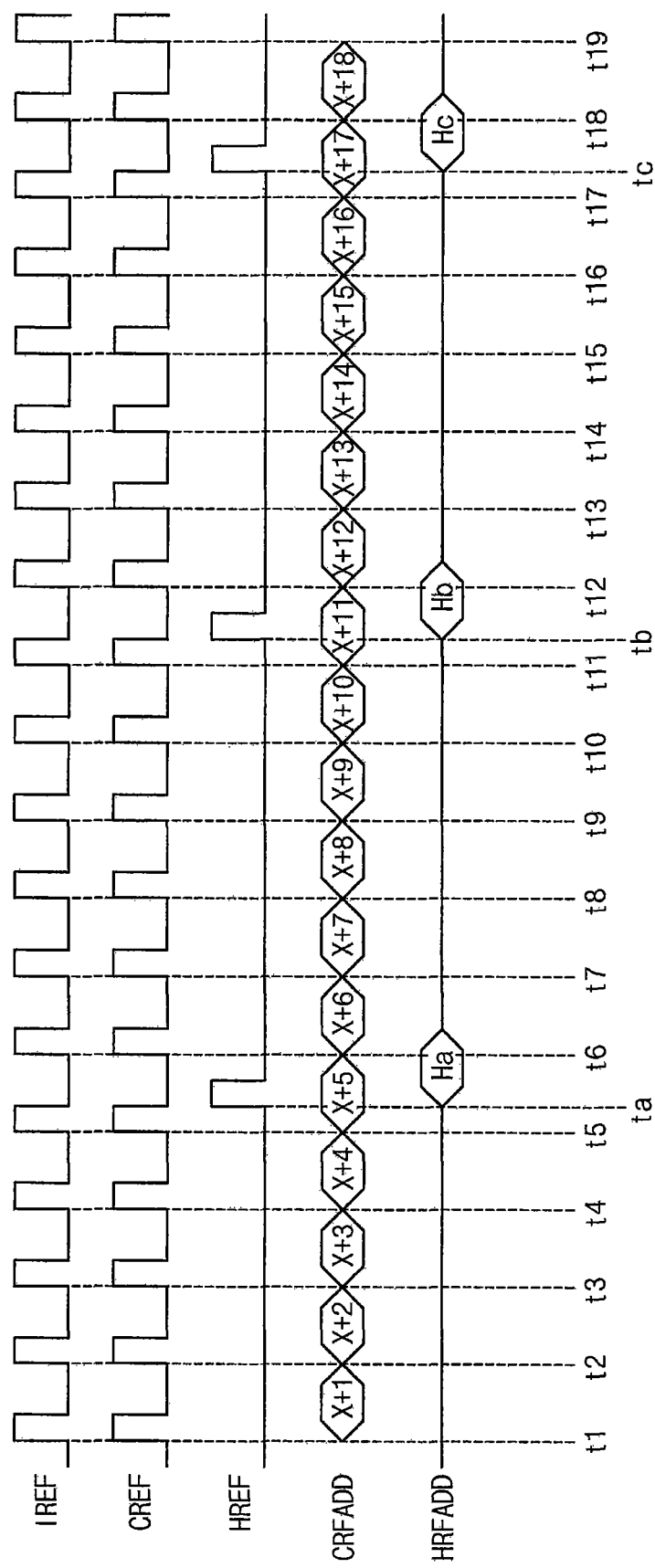
Figure 9C:
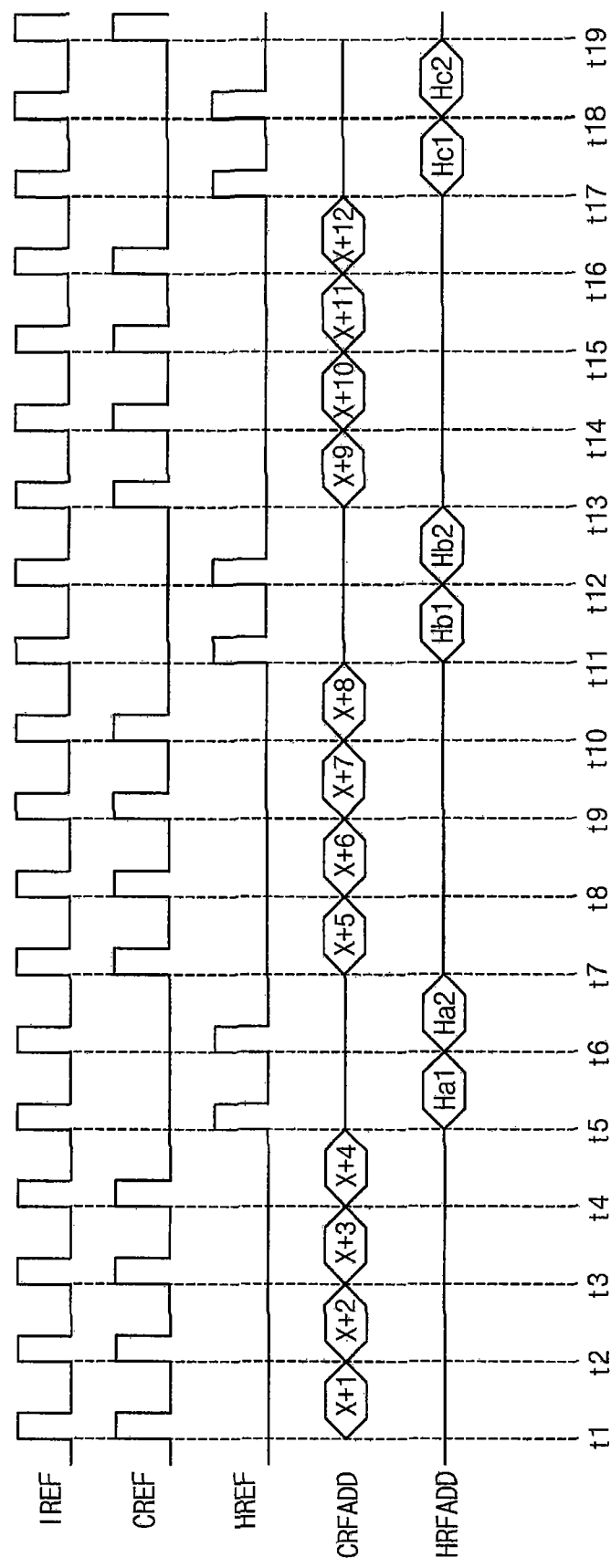

The timing controller 100 may generate a counter refresh signal CREF and a hammer refresh signal HREF based on (e.g., in response to) a refresh signal IREF provided from a memory controller. The operation of the timing controller 100 will be further described below with reference to FIGS. 9A, 9B and 9C. As illustrated in FIGS. 9A, 9B and 9C, the timing controller 100 may selectively activate one of the counter refresh signal CREF and the hammer refresh signal HREF. In some example embodiments, as illustrated in FIG. 1, the timing controller 100 may be included in the embedded refresh controller 10. In some example embodiments, the timing controller 100 may not be provided, and the counter refresh signal CREF and the hammer refresh signal HREF may be provided from other control logics in a memory device.

The refresh counter 200 may generate a counter refresh address signal CRFADD in response to the counter refresh signal CREF such that the counter refresh address signal. CRFADD may represent a sequentially changing address. In some embodiments, the counter refresh address signal CRFADD may correspond to a row address of a memory cell array in the memory device. For example, the refresh counter 200 may increase a value of the counter refresh address signal CRFADD whenever the counter refresh signal CREF is activated. Wordlines in the memory cell array may be selected sequentially for refresh operations by increasing the value of the counter refresh address signal CRFADD.

The address generator 300 may store information with respect to a hammer address that is an address of a row which has been accessed intensively and/or frequently. The address generator 300 may generate a hammer refresh address signal HRFADD in response to the hammer refresh signal HREF such that the hammer refresh address signal HRFADD may correspond to an address of a row that is physically adjacent to the row corresponding to the hammer address. In some embodiments, the hammer refresh address signal HRFADD may include an address of a row that is physically adjacent to the row corresponding to the hammer address. The address generator 300 may include a storage block SB that is configured to store row addresses and respective access count values corresponding to the row addresses as the information with respect to the hammer address based on (e.g., in response to) an active signal IACT and an address signal XADD provided from the memory controller such that each of the access count values may indicate a number of occurrence of access to a respective row addresses. In some embodiments, the hammer refresh address signal HRFADD may correspond to an address of a row that is physically directly adjacent to the row corresponding to the hammer address. It will be understood that there are no intervening rows between the row corresponding to the hammer address and the row that is physically directly adjacent to the row corresponding to the hammer address.

Figure 2:
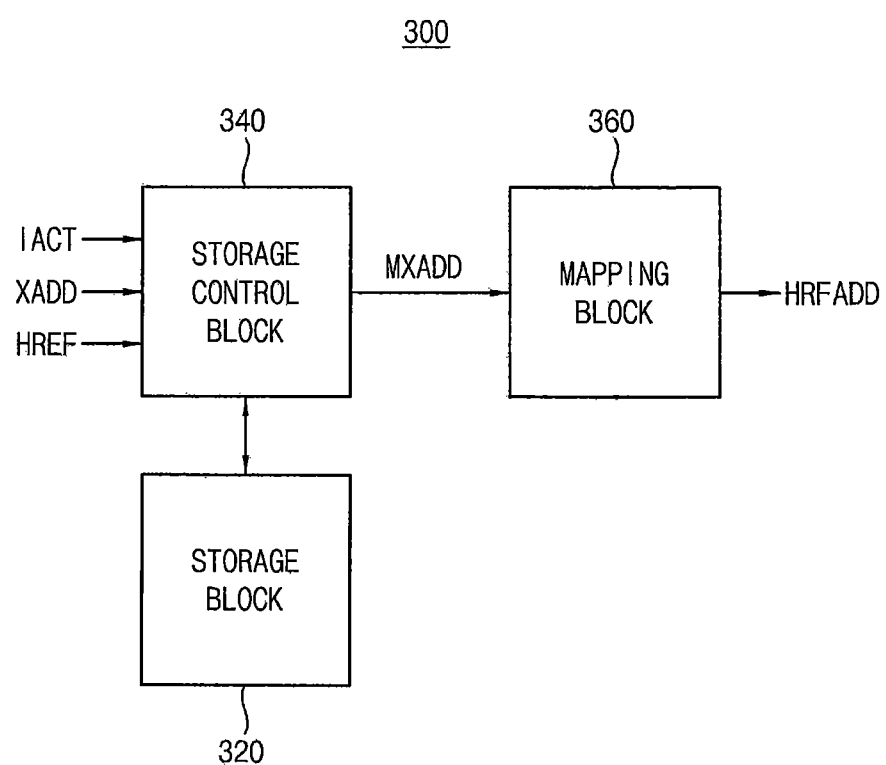
FIG. 2 is a block diagram illustrating an address generator according to example embodiments.
Figure 3:
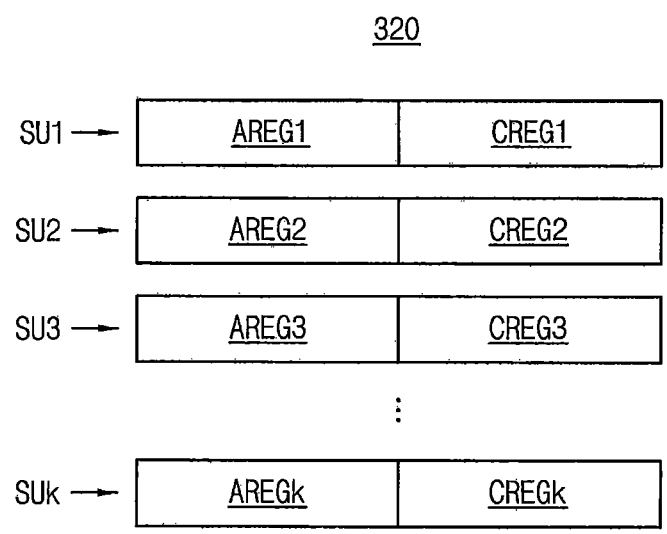
FIG. 3 is a diagram illustrating a storage block according to example embodiments.

FIG. 2 is a block diagram illustrating an address generator according to example embodiments, and FIG. 3 is a diagram illustrating a storage block according to example embodiments.

Referring to FIG. 2, an address generator 300 may include a storage block 320, a storage control block 340 and a mapping block 360.

The storage block 320 may store the information with respect to the hammer address MXADD. In some example embodiments, the storage block 320 may include a plurality of storage units SU1~SUk as illustrated in FIG. 3. The storage units SU1~SUk may include address registers AREG1~AREGk storing the row addresses that are accessed and count registers CREG1~CREGk storing access count values corresponding to the row addresses.

The storage control block 340 may control the storage block 320 based on (e.g., in response to) the hammer refresh signal HREF, the active signal IACT and the address signal XADD provided from the memory controller. Also the storage control block 340 may provide the hammer address MXADD based on the information stored in the storage block 320. The operation of the storage control block 340 will be further described below with reference to FIGS. 5A through 6C.

The mapping block 360 may generate the hammer refresh address signal HRFADD based on the hammer address MXADD. As will be described below with reference to FIG. 4, the hammer refresh address signal HRFADD may correspond to an address of a row that is physically adjacent to (e.g., physically directly adjacent to) the row corresponding to the hammer address MXADD. In some example embodiments, as illustrated in FIGS. 9A and 9B, the mapping block 360 may provide an address of one row of two adjacent rows, in response to activation of the hammer refresh signal HREF. In some example embodiments, as illustrated in FIG. 9C, the mapping block 360 may sequentially provide addresses corresponding to two adjacent rows (e.g., two directly adjacent rows) in response to activation of the hammer refresh signal HREF.

Figure 4:
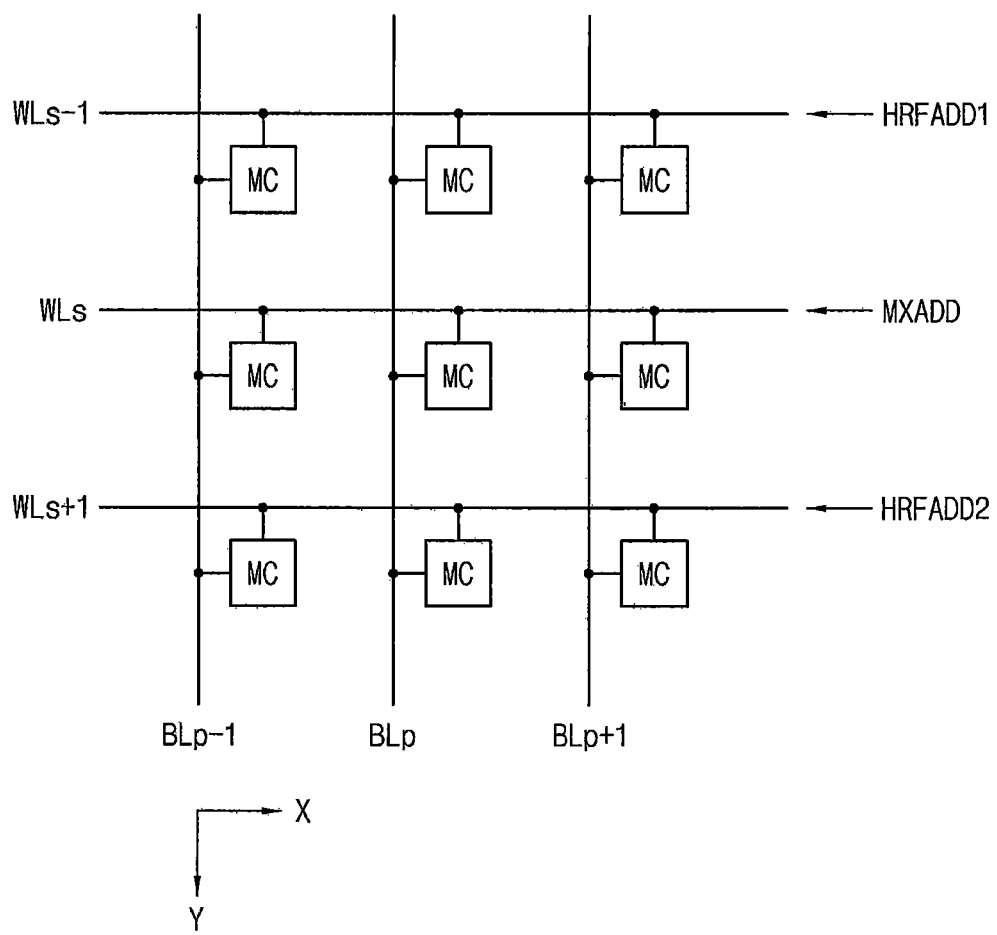
FIG. 4 is a diagram illustrating a portion of a memory cell array.

FIG. 4 is a diagram illustrating a portion of a memory cell array.

FIG. 4 illustrates three wordlines WLs−1, WLs and WLs+1, three bitlines BLp−1, BLp and BLp+1 and memory cells MC coupled to the wordlines WLs−1, WLs and WLs+1 and the bitlines BLp−1, BLp and BLp+1 in the memory cell array. The three wordlines WLs−1, WLs and WLs+1 are extended in a row direction (i.e., X direction) and arranged sequentially along a column direction (i.e., Y direction). The three bitlines BLp−1, BLp and BLp+1 are extended in the column direction and arranged sequentially along the row direction. It will be understood that the wordlines WLs−1 and WLs are physically directly adjacent to each other since there are no intervening wordlines between the wordlines WLs−1 and WLs.

For example, the middle wordline WLs may correspond to the hammer address MXADD that has been accessed intensively. It will be understood that "an intensively-accessed wordline" refers to a wordline that has a relatively higher activation number and/or has a relatively higher activation frequency. For example, the number of times that the middle wordline WLs has been activated may be greater than the number of times that other wordlines WLs−1 and WLs+1 have been activated and/or the middle wordline WLs has been activated at a frequency higher than that of other wordlines WLs−1 and WLs+1. Whenever the hammer wordline (e.g., the middle wordline WLs) is accessed, the hammer wordline WLs is enabled and precharged, and the voltage level of the hammer wordline WLs is increased and decreased. Wordline coupling may cause the voltage levels of the adjacent wordlines WLs−1 and WLs+1 to fluctuate as the voltage level of the hammer wordline WLs varies, and thus the cell charges of the memory cells MC coupled to the adjacent wordlines WLs−1 and WLs+1 are affected. As the hammer wordline WLs is accessed more frequently, the cell charges of the memory cells MC coupled to the adjacent wordlines WLs−1 and WLs+1 may be lost more rapidly.

According to example embodiments, the address generator 300 may provide the hammer refresh address signal HRFADD representing the addresses HRFADD1 and HRFADD2 of the rows (e.g., the wordlines WLs−1 and WLs+1) that are physically adjacent to the row of the hammer address MXADD (e.g., the middle wordline WLs), and an refresh operation for the adjacent wordlines WLs−1 and WLs+1 may be performed additionally based on (e.g., in response to) the hammer refresh address signal HRFADD to reduce or possibly prevent the loss of data stored in the memory cells MC.

FIGS. 5A, 5B, 5C and 5D are diagrams illustrating methods of counting access numbers according to example embodiments.

Even though FIGS. 5A, 5B, 5C and 5D illustrate an example that the storage block SB includes four storage units SU1, SU2, SU3 and SU4 for convenience of illustration and description, the number of the storage units may be changed variously. FIGS. 5A, 5B, 5C and 5D illustrate a row address of an address signal XADD at an activation time point Ta of an active control signal IACT, and the states of the storage block SB before and after the activation time point Ta of the active control signal IACT.

Figure 5A:
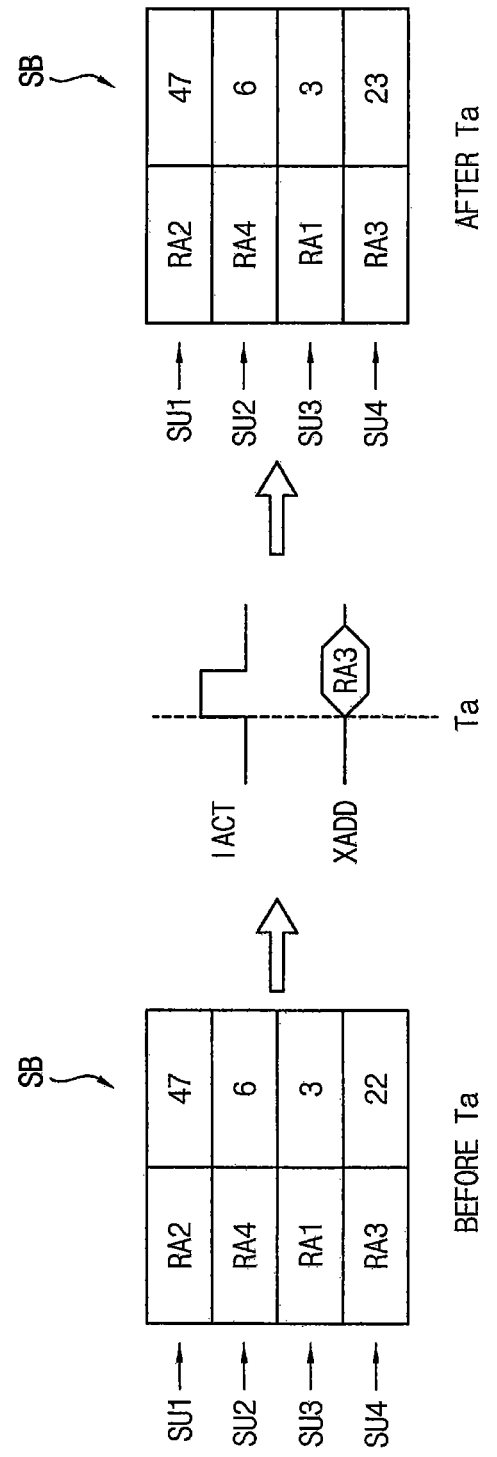

Referring to FIGS. 2 and 5A, when the row address RA3, which is one of the row addresses RA1, RA2, RA3 and RA4 stored in the storage block SB, is input through the address signal XADD, the storage control block 340 in the address generator 300 may increase the access count value corresponding to the input row address RA3 by one, from 22 to 23. As such, the address generator 300 may accumulate the access count values.

Figure 5B:
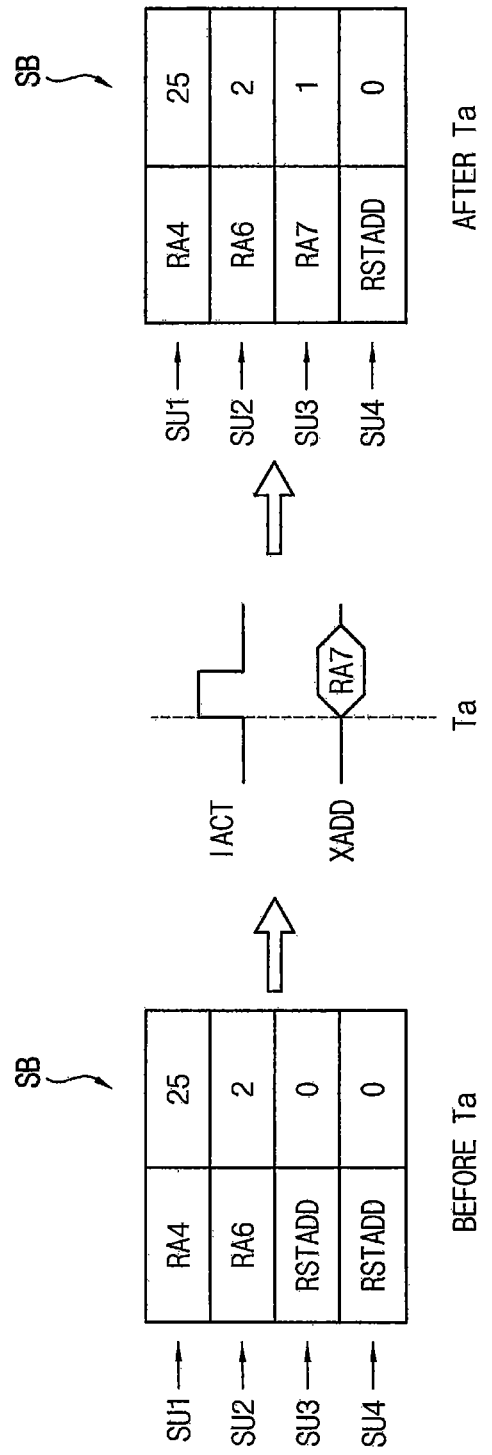

Referring to FIGS. 2 and 5B, when the row address RA7, which is not one of the row addresses RA4 and RA6 stored in the storage block SB, is input through the address signal XADD and when some storage units (e.g., SU3 and SU4) have been initialized to a reset address RSTADD, the storage control block 340 may store the input row address RA7 and the corresponding access count value in one storage unit SU3 that has been initialized. For example, the reset address RSTADD may correspond to a predetermined value such as "0000", "1111", etc. When a reset address RSTADD is stored in the storage unit, the storage unit may be regarded as an unoccupied space in which a valid address is not stored.

Figure 5C:
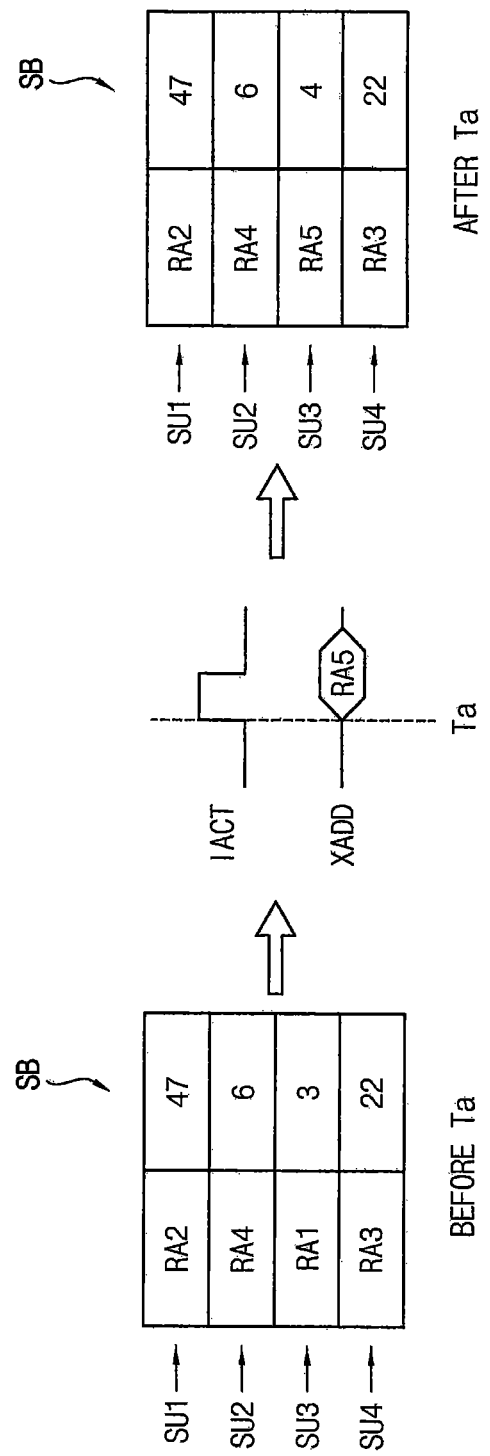

Referring to FIGS. 2, 5C and 5D, when a new row address RA5 is accessed while all of the storage units SU1, SU2, SU3 and SU4 are occupied by the row addresses RA1, RA2, RA3 and RA4, the storage control block 340 in the address generator 300 may store the new row address RA5 by replacing the row address RA1 stored in the storage unit SB corresponding to a minimum access count value "3" among the access count values "47, 6, 3 and 22". It will be understood that "a minimum access count value" refers to a lowest access count value among the access count values stored in the storage control block 340. In some example embodiments, as illustrated in FIG. 5C, the access count value "3" corresponding to the replaced row address RA1 may be maintained and the access count value of the new row address RA5 may be stored as "4". In some embodiments, as illustrated in FIG. 5D, the access count value "3" corresponding to the replaced row address RA1 may be initialized to "0" and the access count value of the new row address RA5 may be stored as "1".

Figure 6A:
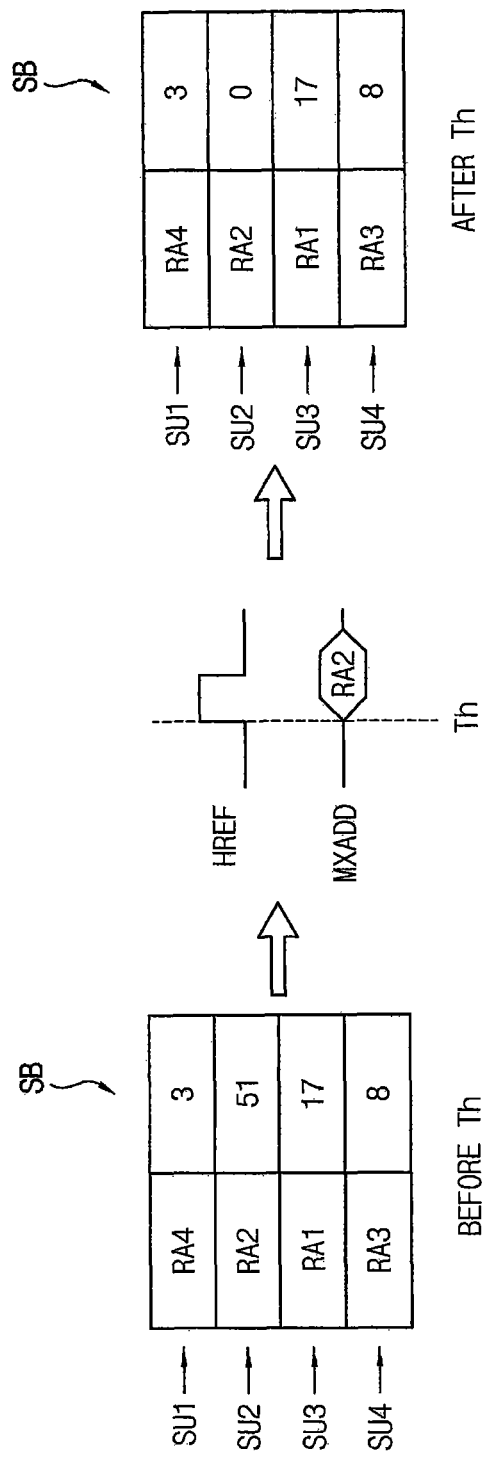
FIGS. 6A, 6B and 6C are diagrams illustrating methods of determining a hammer address according to example embodiments.
Figure 6B:
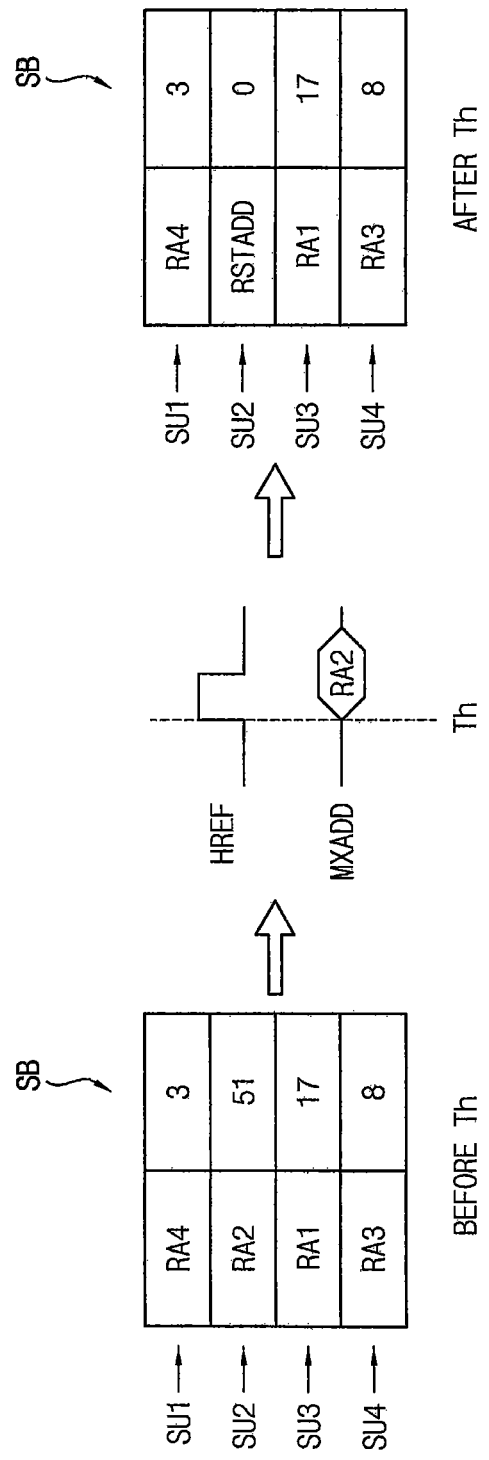
Figure 6C:
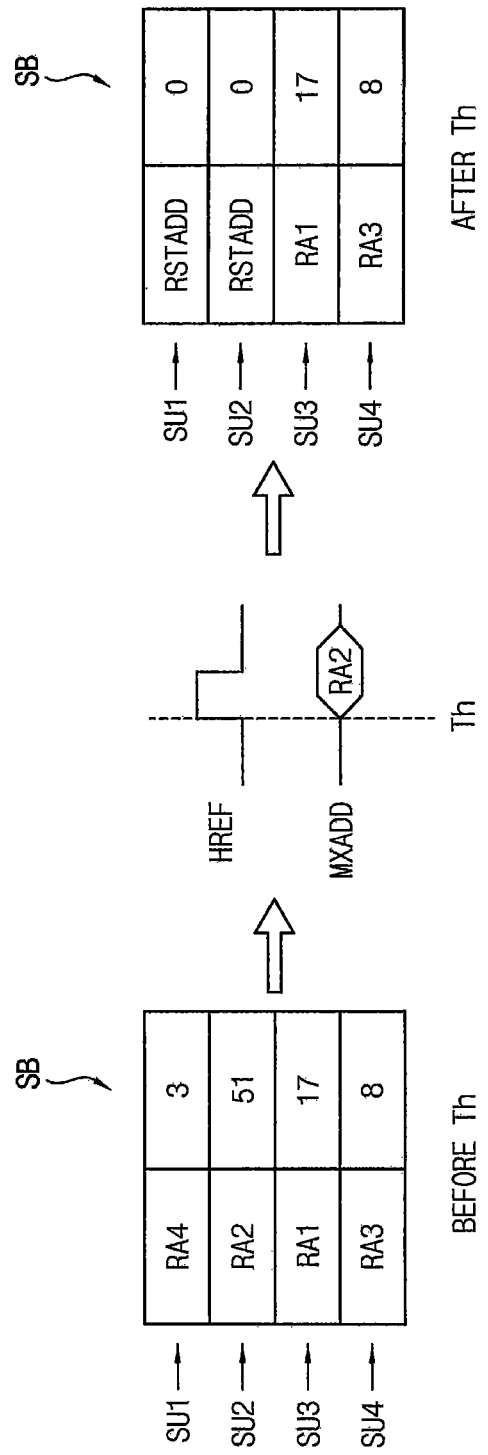

FIGS. 6A, 6B and 6C are diagrams illustrating methods of determining a hammer address according to example embodiments.

Even though FIGS. 6A, 6B and 6C illustrate an example that the storage block SB includes four storage units SU1, SU2, SU3 and SU4 for convenience of illustration and description, the number of the storage units may be changed variously. FIGS. 6A, 6B and 6C illustrate a row address that is determined to be a hammer address MXADD at an activation time point Th of the hammer refresh signal HREF, and the states of the storage block SB before and after the activation time point Th of the hammer refresh signal HREF.

Referring to FIGS. 2, 6A, 6B and 6C, the storage control block 340 in the address generator 300 may determine the hammer address MXADD as the row address RA2, among the stored row addresses RAF~RA4, corresponding to a maximum access count value "51" among the access count values "3, 51, 17, 8" at the activation time point Th of the hammer refresh signal HREF. It will be understood that "a maximum access count value" refers to a highest access count value among the access count values stored in the storage control block 340. The storage control block 340 may not compare the access count value with a predetermined threshold value and may determine the hammer address MXADD based on the maximum count value at the activation time point Th of the hammer refresh signal HREF.

As illustrated in FIGS. 6A and 6B, the storage control block 340 may initialize the maximum access count value "51" to zero and maintain the other access count values "3, 17, 8" after determining the hammer address MXADD as the row address RA2 corresponding to the maximum access count value "51". The storage control block 340 may initialize the maximum access count value "51" to zero without changing the other access count values "3, 17, 8" after determining the hammer address MXADD. In some embodiments, the row address RA2 corresponding to the maximum access count value "51" may be maintained in the storage block SB as shown in FIG. 6A. In some embodiments, the row address RA2 corresponding to the maximum access count value "51" may be initialized to the reset address RSTADD as shown in FIG. 6B.

As illustrated in FIG. 6C, in some embodiments, the storage control block 340 may initialize the maximum access count value "51" and a minimum access count value "3" among the access count values "3, 51, 17, 8" to zero and maintain the other access count values "17, 8" after determining the hammer address MXADD as the row address RA2 corresponding to the maximum access count value "51". The storage control block 340 may initialize the maximum access count value "51" and the minimum access count value "3" among the access count values "3, 51, 17, 8" to zero without changing the other access count values "17, 8" after determining the hammer address MXADD. In some embodiments, the row addresses RA4 and RA2 corresponding to the initialized access count values "3, 51" may be maintained in the storage block SB. In some embodiments, the row addresses RA4 and RA2 corresponding to the initialized access count values "3, 51" may be initialized to the reset address RSTADD as shown in FIG. 6C.

Figure 7:
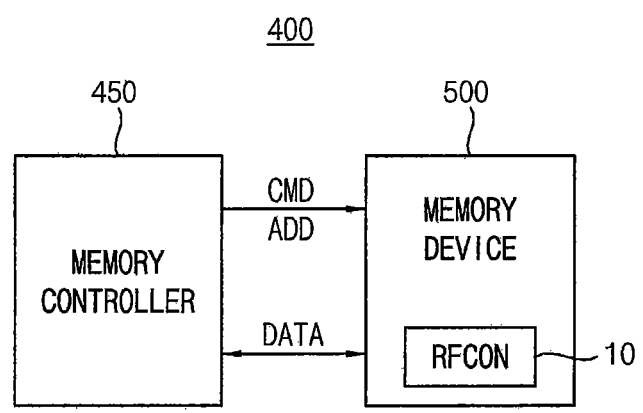
FIG. 7 is a block diagram illustrating a memory system including an embedded refresh controller according to example embodiments.
Figure 8:
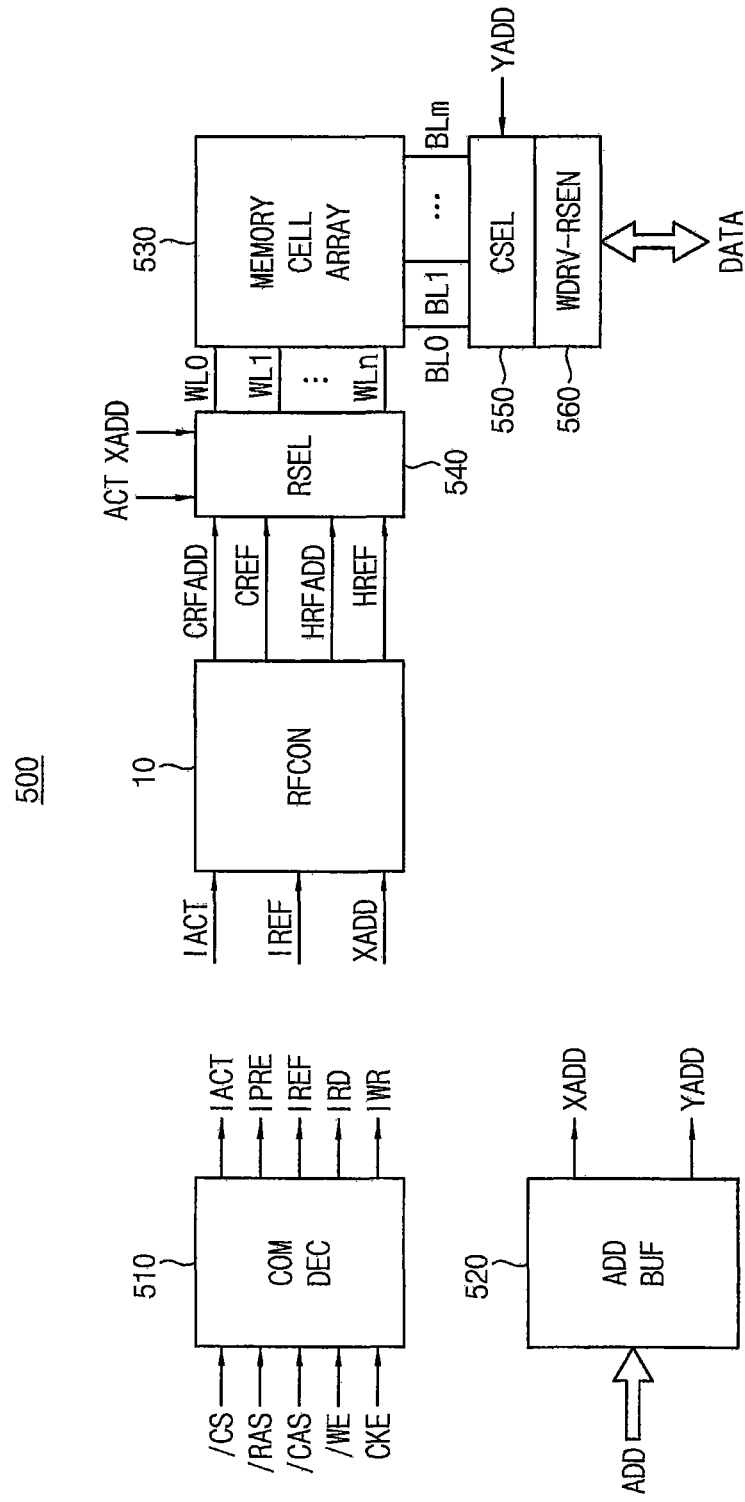
FIG. 8 is a block diagram illustrating a memory device including an embedded refresh controller according to example embodiments.

FIG. 7 is a block diagram illustrating a memory system including an embedded refresh controller according to example embodiments, and FIG. 8 is a block diagram illustrating a memory device including an embedded refresh controller according to example embodiments.

Referring to FIG. 7, a memory system 400 may include a memory controller 450 and a memory device 500. Referring to FIG. 8, the memory device 500 may include a command decoder COM DEC 510, an address buffer ADD BUF 520, a memory cell array 530, a row selection circuit RSEL 540, a column selection circuit CSEL 550; an input-output circuit 560 and an embedded refresh controller RFCON 10. The input-output circuit 560 may include a write driver WDRV and a read sensing circuit RSEN.

The memory device 500 may include an interface for communicating with the memory controller 450. For example, the memory device 500 may include a DRAM interface. The DRAM interface may include control pads (or pins), address pads and data pads. The memory device 500 may receive a command CMD, that is, control signals such as a chip selection signal/CS, a row address strobe signal/RAS, a column address strobe signal/CAS, a write enable signal/WE, a clock enable signal CKE, etc. through the control pads. The memory device 500 may receive the address signal ADD through the address pads, and receive the write data or transmit the read data through the data pads.

The memory cell array 530 may include a plurality of memory cells respectively coupled to a plurality of wordlines WL0 through WLn and a plurality of bitlines BL0 through BLm. The memory cells may have a configuration that needs a refresh such as a DRAM cell.

The command decoder 510 may generate internal command signals such as an active signal IACT, a precharge signal IPRE, a refresh signal IREF, a read signal IRD, a write signal IWR, etc. based on the control signals/CS, /RAS, /CAS, /WE and CKE from the memory controller 450 in FIG. 7.

As described above, the embedded refresh controller 10 may receive the active signal IACT, the refresh signal IREF and the address signal XADD and may provide the counter refresh signal CREF, the hammer refresh signal HREF, the counter refresh address signal CRFADD and the hammer refresh address signal HRFADD for the refresh operation.

The address buffer 520 may generate a row address signal XADD and a column address signal YADD based on an external address ADD transferred from the memory controller 450. The row address signal XADD may be provided to the row selection circuit 540 and the column address signal YADD may be provided to the column selection circuit 550. Even though not illustrated in FIG. 8, the memory cell array 530 may include a plurality of memory banks and the address buffer 520 may further provide a bank address signal.

The row selection circuit 540 may select a wordline corresponding to the row address signal XADD among the wordlines WL0 through WLn for a read operation or a write operation. Also the row selection circuit 540 may select a wordline corresponding to the counter refresh address signal CRFADD or the hammer refresh address signal HRFADD among the wordlines WL0 through WLn for a refresh operation. The row selection circuit 540 may select a wordline corresponding to the counter refresh address signal CRFADD when the counter refresh signal CREF is activated, and the row selection circuit 530 may select a wordline corresponding to the hammer refresh address signal HRFADD when the hammer refresh signal CREF is activated. The column selection circuit 550 may select a bitline corresponding to the column address signal YADD among the bitlines BL0 through BLm.

The write driver WDRV and the read sensing circuit RSEN are coupled to the bitlines BL0 through BLm. The write driver WDRV and the read sensing circuit RSEN may be coupled to the bitlines BL0 through BLm directly or via the column selection circuit 550.

FIGS. 9A, 9B and 9C are timing diagrams illustrating operations of an embedded refresh controller according to example embodiments.

FIGS. 9A, 9B and 9C illustrate generations of a counter refresh signal CREF, a hammer refresh signal HREF, a counter refresh address signal CRFADD and a hammer refresh address signal HRFADD, with respect to a refresh signal IREF that is activated in a pulse shape. The intervals between the activation time points t1~t9 of the refresh signal IREF may be regular or irregular.

Referring to FIGS. 1, 2 and 9A, the timing controller 100 may activate the counter refresh signal CREs in synchronization with some time points t1~t4, t6~t10, t12~t16 and t18~t19 among the activation time points t1~t19 of the refresh signal IREF, and may activate the hammer refresh signal HREF in synchronization with the other time points t5, t11 and t17. Even though FIG. 9A illustrates that the counter refresh signal CREF is activated five times and then the hammer refresh signal HREF is activated once, the activation ratio of the counter refresh signal CREF and the hammer refresh signal HREF may be changed variously.

The refresh counter 200 may generate the counter refresh address signal CRFADD representing the sequentially changing addresses X+1~X+15 in synchronization with the activation time points t1~t4, t6~t10, t2~t16 and t18~t19 of the counter refresh signal CREF. In some embodiments, the counter refresh address signal CRFADD may correspond to a row address of a memory cell array in a memory device. The address generator 300 may generate the hammer refresh address signal HRFADD representing the address Ha, Hb and He of the rows that are physically adjacent to the row of the hammer address MXADD in synchronization with the activation time points t5, t11 and t17 of the hammer refresh signal HREF. As illustrated in FIG. 9A, the mapping block 360 in the address generator 300 may provide an address corresponding to one row among the two adjacent rows. For example, the address Ha may be smaller by 1 than the hammer address at time point t5, and the address Hb may be larger by 1 than the hammer address at time point t11. As such, the mapping block 360 may provide the smaller address or the larger address than the hammer address signal MXADD alternatively at each activation time point of the hammer refresh signal HREF.

Referring to FIGS. 1, 2 and 9B, the timing controller 100 may activate the counter refresh signal CREF in synchronization with the activation time points t1~t19 of the refresh signal IREF, and activate the hammer refresh signal HREF in synchronization with the time points ta, tb and tc while the refresh signal IREF is deactivated. Even though FIG. 9B illustrates that the counter refresh signal CREF is activated six times and then the hammer refresh signal HREF is activated once, the activation ratio of the counter refresh signal CREF and the hammer refresh signal HREF may be changed variously.

The refresh counter 200 may generate the counter refresh address signal CRFADD representing the sequentially changing addresses X+1~X+18 in synchronization with the activation time points t1~t19 of the counter refresh signal CREF. The address generator 300 may generate the hammer refresh address signal HRFADD representing the address Ha, Hb and Hc of the rows that are physically adjacent to the row of the hammer address MXADD in synchronization with the activation time points ta, tb and tc of the hammer refresh signal HREF. As illustrated in FIG. 9B, the mapping block 360 in the address generator 300 may provide an address corresponding to one row among the two adjacent rows. For example, the address Ha may be smaller by 1 than the hammer address at time point ta, and the address Hb may be larger by 1 than the hammer address at time point tb. As such, the mapping block 360 may provide the smaller address or the larger address than the hammer address signal MXADD alternatively at each activation time point of the hammer refresh signal HREF.

Referring to FIGS. 1, 2 and 9C, the timing controller 100 may activate the counter refresh signal CREF in synchronization with some time points t1~t4, t7~t10, t13~t16 and t19 among the activation time points t1~t19 of the refresh signal IREF, and activate the hammer refresh signal HREF in synchronization with the other time points t5, t6, t11, t12, t17 and t18. Even though FIG. 9C illustrates that the counter refresh signal CREF is activated four times and then the hammer refresh signal HREF is activated two times, the activation ratio of the counter refresh signal CREF and the hammer refresh signal HREF may be changed variously.

The refresh counter 200 may generate the counter refresh address signal CRFADD representing the sequentially changing addresses X+1~X+12 in synchronization with the activation time points t1~t4, t7~t10, t13~t16 and t19 of the counter refresh signal CREF. The address generator 300 may generate the hammer refresh address signal HRFADD representing the address Ha1, Ha2, Hb1, Hb2, Hc1 and Hc2 of the rows that are physically adjacent to the row of the hammer address MXADD in synchronization with the activation time points t5, t6, t11, t12, t17 and t18 of the hammer refresh signal HREF. As illustrated in FIG. 9C, the mapping block 360 in the address generator 300 may sequentially provide the addresses corresponding to the two adjacent rows. For example, the address Ha1 may be smaller by 1 than the hammer address at time point t5, and the address Ha2 may be larger by 1 than the hammer address at time point t5. As such, the mapping block 360 may provide the smaller address or the larger address than the hammer address signal MXADD alternatively at each activation time point of the hammer refresh signal HREF.

Figure 10:
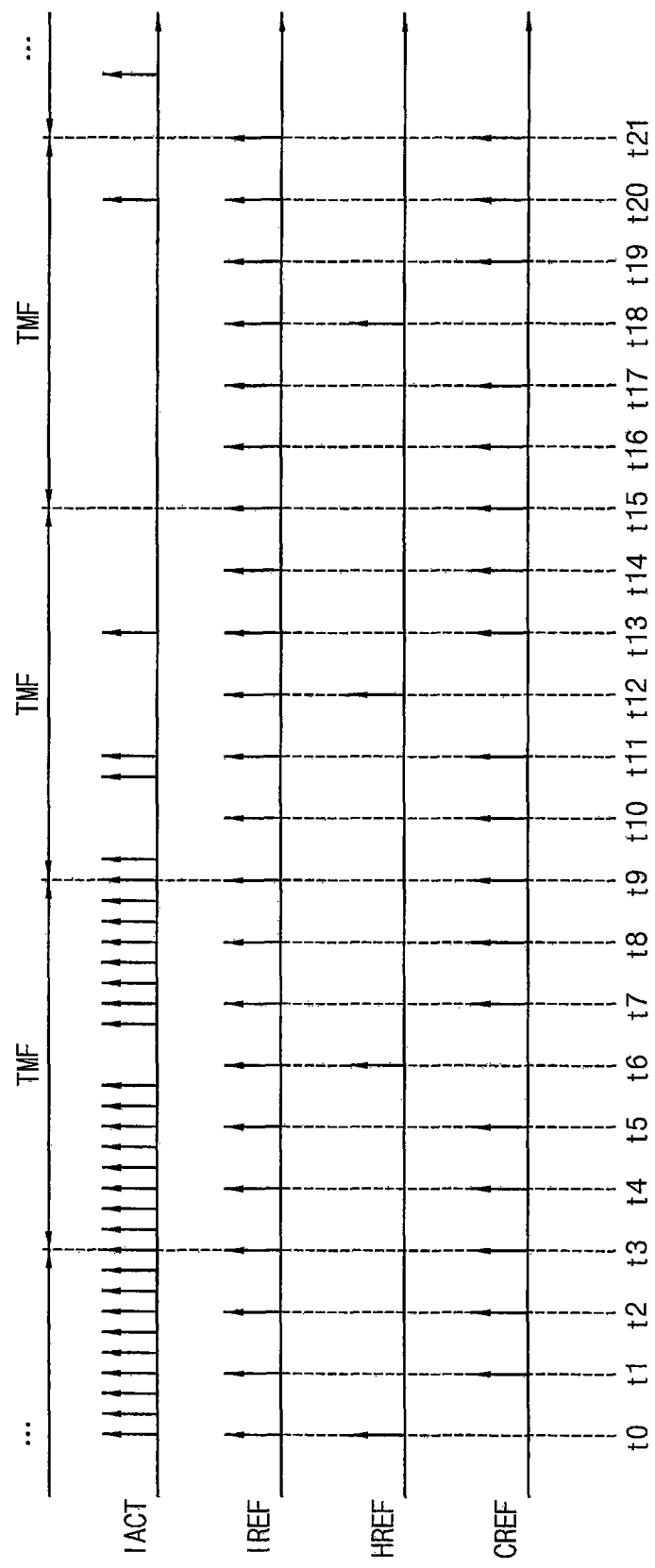
FIG. 10 is a diagram illustrating a method of determining a hammer address according to example embodiments.

FIG. 10 is a diagram illustrating a method of determining a hammer address according to example embodiments.

The arrows in FIG. 10 may represent activation time points of corresponding signals. As illustrated in FIG. 10, the activation time points of the active signal IACT may be irregular. The active signal IACT may be activated with very high frequency during a time duration or with very low frequency during another time duration. For example, time frames TMF may be set for detection and determination of the hammer address MXADD as illustrated in FIG. 10, and the access count values stored in the storage block SB in FIG. 3 may be initialized at the end time points of the respective time frame TMF. As appreciated by the present inventors, the address that has not been accessed intensively may be determined as the hammer address MXADD due to the irregular frequency of the activation of the active signal IACT if the access count values are initialized at the end time points of the respective time frame TMF. According to example embodiments, as described with reference to FIGS. 5A through 6C, the storage control block 340 in the address generator 300 may accumulate the access count values continuously over time without setting the time frame TMF for initializing the access count values stored in the storage block 360. In some embodiments, the address generator 300 may increase the access count values without initializing the access count values stored in the storage block 360 in each of time frames. As illustrated in FIG. 10, the hammer refresh signal HREF or the counter refresh signal CREF may be activated selectively in synchronization with the activation time points t0~t21 of the refresh signal IREF and the row address corresponding to the maximum access count may be determined as the hammer address MXADD at the activation time points t0, t6, t12 and t18 of the hammer refresh signal HREF.

As such, the embedded refresh controller and the memory device including the embedded refresh controller according to example embodiments may reduce or possibly prevent loss of cell data and may enhance performance of the memory device by detecting the intensively-accessed hammer address and performing the refresh operation based on the detected hammer address efficiently.

Figure 11:
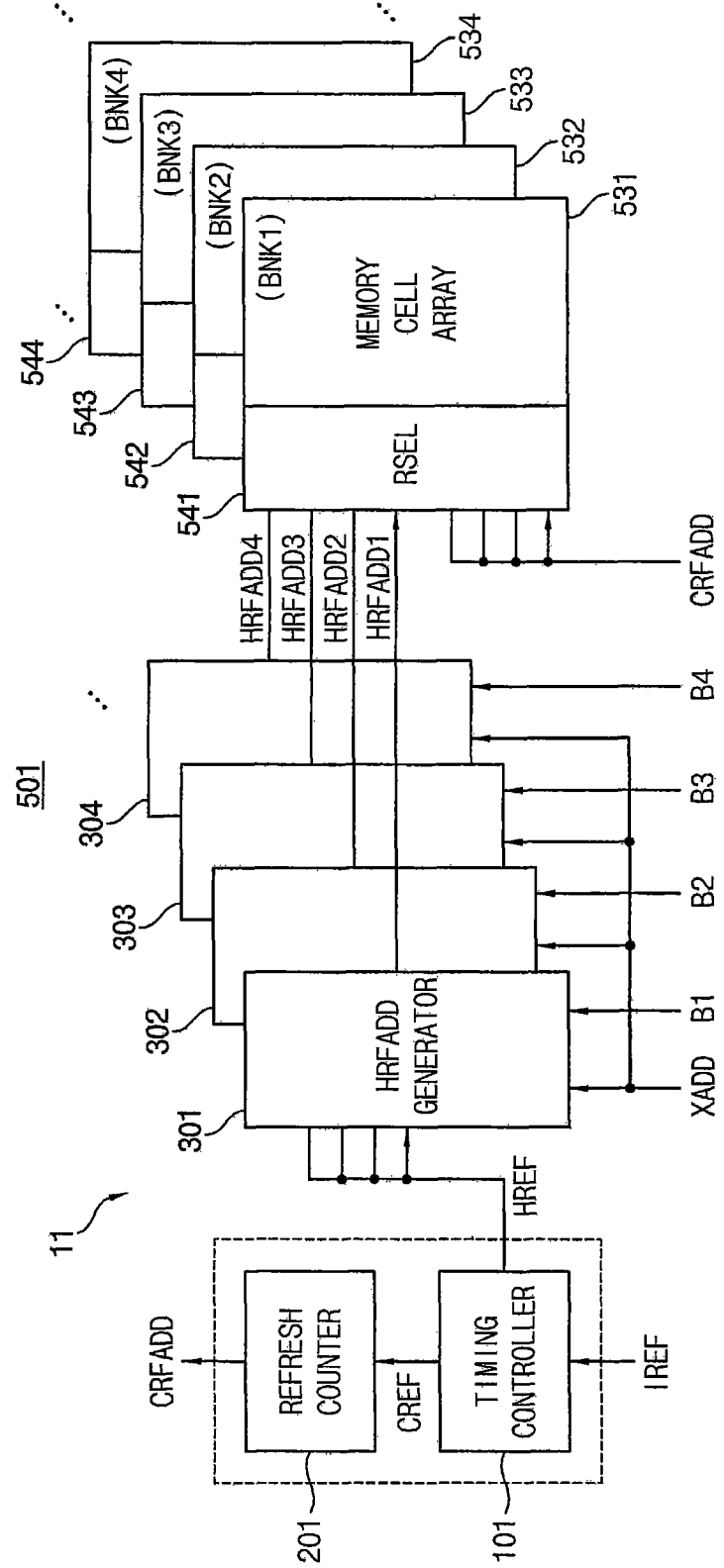
FIG. 11 is a block diagram illustrating a memory device including an embedded refresh controller according to example embodiments.

FIG. 11 is a block diagram illustrating a memory device including an embedded refresh controller according to example embodiments. FIG. 11 illustrates example embodiments including a memory device having a multi-bank structure.

Referring to FIG. 11, a memory device 501 may have a multi-bank structure where the memory cell array includes a plurality of memory banks 531, 532, 533 and 534. An embedded refresh controller 11 according to example embodiments may include a timing controller 101, a refresh counter 201 and an address generator. The address generator may include a plurality of sub-generators 301, 302, 303 and 304.

The timing controller 101 may generate a counter refresh signal CREF and a hammer refresh signal HREF, which are activated selectively, based on a refresh signal IREF provided from a memory controller. The refresh counter 201 may generate a counter refresh address signal CRFADD in response to the counter refresh signal CREF such that the counter refresh address signal CRFADD may represent a sequentially changing address. The sub-generators 301, 302, 303 and 304 may correspond to the memory banks 531, 532, 533 and 534, respectively and generate the hammer refresh address signal HRFADD1, HRFADD2, HRFADD3 and HRFADD4 independently. In other words, the sub-generators 301, 302, 303 and 304 may detect the hammer address of the respective memory banks 531, 532, 533 and 534 independently based on the row address signal XADD and bank control signals B1, B2, B3 and B4. The bank control signals B1, B2, B3 and B4 may be generated in the memory device 501 based on a bank address signal provided from the memory controller, and one of memory banks 531, 532, 533 and 534 may be selected in response to the bank control signals B1, B2, B3 and B4. The counter refresh signal CREF, the hammer refresh signal HREF and the counter refresh address signal CRFADD may be provided commonly to the memory banks 531, 532, 533 and 534.

Figure 12A:
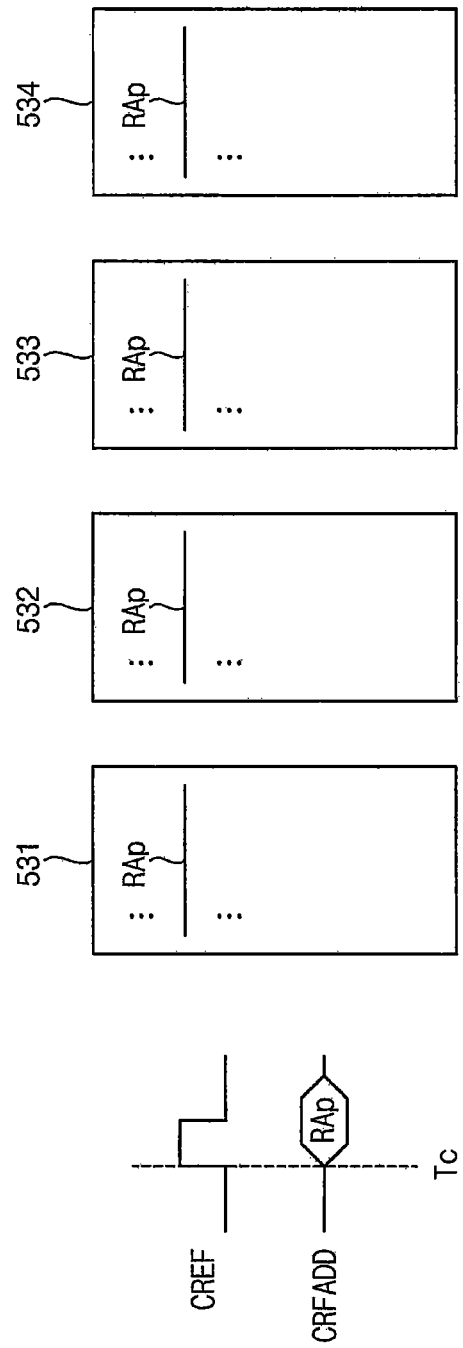
FIGS. 12A and 12B are diagrams illustrating an operation of the memory device of FIG. 11.
Figure 12B:
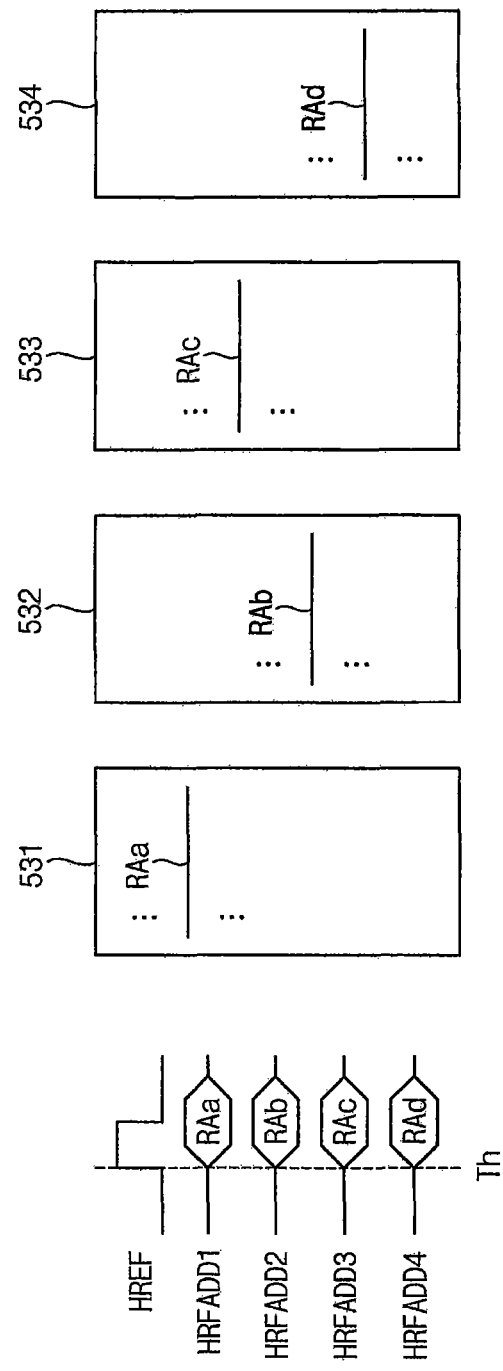

FIGS. 12A and 12B are diagrams illustrating an operation of the memory device in FIG. 11.

Referring to FIG. 12A, the counter refresh address signal CRFADD representing the refresh address RAp may be provided commonly to the memory banks 531, 532, 533 and 534 at an activation time point Tc of the counter refresh signal CREF. As a result, the memory cells included in rows having addresses corresponding to the counter refresh address signal CRFADD may be refreshed simultaneously in all of the memory banks 531, 532, 533 and 534. In some embodiments, the rows in the memory banks 531, 532, 533 and 534 that are refreshed simultaneously in response to the counter refresh signal CREF may have the same row address as illustrated in FIG. 12A.

Referring to FIG. 12B, the hammer refresh address signals HRFADD1, HRFADD2, HRFADD3 and HRFADD4 representing the refresh addresses RAa, RAb, RAc and RAd may be provided respectively to the memory banks 531, 532, 533 and 534 at an activation time point Th of the hammer refresh signal HREF. As a result, the memory cells included in rows that having different addresses RAa, RAb, RAc and RAd in the respective memory banks 531, 532, 533 and 534 corresponding to the hammer refresh address signals HRFADD1, HRFADD2, HRFADD3 and HRFADD4 may be refreshed simultaneously in all of the memory banks 531, 532, 533 and 534. In some embodiments, the rows in the memory banks 531, 532, 533 and 534 that are refreshed simultaneously in response to the hammer refresh signal HREF may have different row addresses as illustrated in FIG. 12B.

Figure 13:
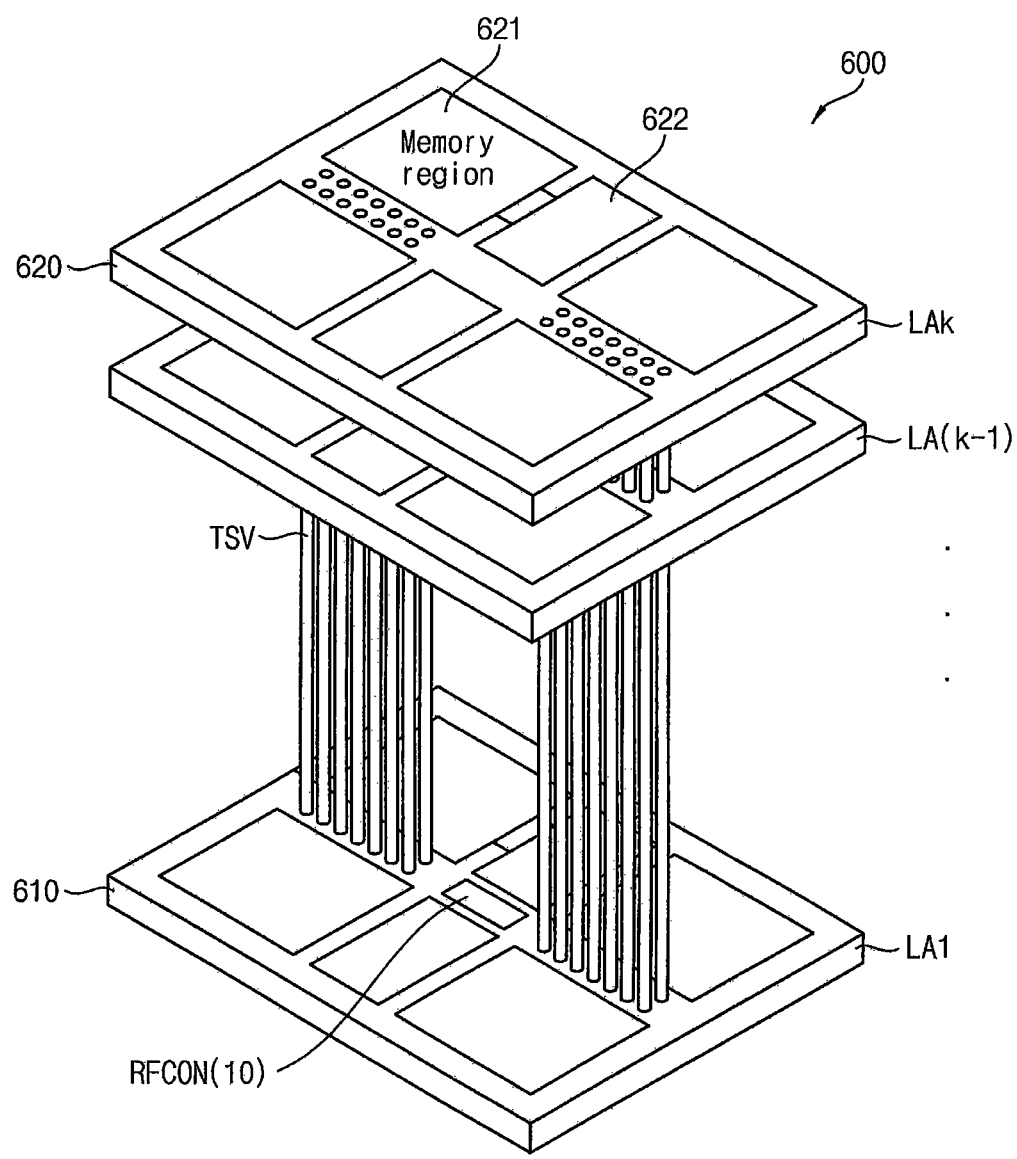
FIG. 13 is a diagram illustrating a structure of a stacked memory device according to example embodiments.

FIG. 13 is a diagram illustrating a structure of a stacked memory device according to example embodiments.

Referring to FIG. 13, a semiconductor memory device 600 may include first through kth semiconductor integrated circuit layers LA1 through LAk, in which the first semiconductor integrated circuit layer LA1 may be a master layer and the other semiconductor integrated circuit layers LA2 through LAk may be slave layers.

The first through kth semiconductor integrated circuit layers LA1 through LAk may transmit and receive signals between the layers by through-substrate vias (e.g., through-silicon vias) TSVs. The first semiconductor integrated circuit layer LA1 as the master layer may communicate with an external device (e.g., a memory controller) through a conductive structure formed on an external surface of the semiconductor memory device 600. Structures and, operations of the semiconductor memory device 600 may be described mainly with reference to the first semiconductor integrated circuit layer LA1 or 610 as the master layer and the kth semiconductor integrated circuit layer LAk or 620 as the slave layer.

The first semiconductor integrated circuit layer 610 and the kth semiconductor integrated circuit layer 620 may include memory regions 621 and various peripheral circuits for driving the memory regions 621. For example, the peripheral circuits may include a row (X)-driver for driving wordlines of the memory regions 621, a column (Y)-driver for driving bitlines of the memory regions 621, a data input/output unit (Din/Dout) for controlling input/output of data, a command buffer (CMD) for receiving a command CMD from outside and buffering the command CMD, and an address buffer (ADDR) for receiving an address from outside and buffering the address.

The first semiconductor integrated circuit layer 610 may further include a control circuit and the control circuit may generate control signals to control the memory regions 621 based on the command-address signals from the memory controller.

The first semiconductor integrated circuit layer 610 may further include an embedded refresh controller RFCON 10 according to example embodiments. In some embodiments, the first semiconductor integrated circuit layer 610 may be a die, and both the memory region 621 and the embedded refresh controller RFCON 10 may be in the same die. As described above, the embedded refresh controller 10 may include a refresh counter and an address generator. The refresh counter may generate a counter refresh address signal in response to a counter refresh signal such that the counter refresh address signal may represent a sequentially changing address. The address generator may store information with respect to a hammer address that is accessed intensively and may generate a hammer refresh address signal in response to a hammer refresh signal such that the hammer refresh address signal may represent an address of a row that is physically adjacent to a row of the hammer address. The embedded refresh controller 10 may reduce or possibly prevent loss of cell data and may enhance performance of the memory device 600 by detecting the intensively-accessed hammer address and performing the refresh operation based on the detected hammer address efficiently.

Figure 14:
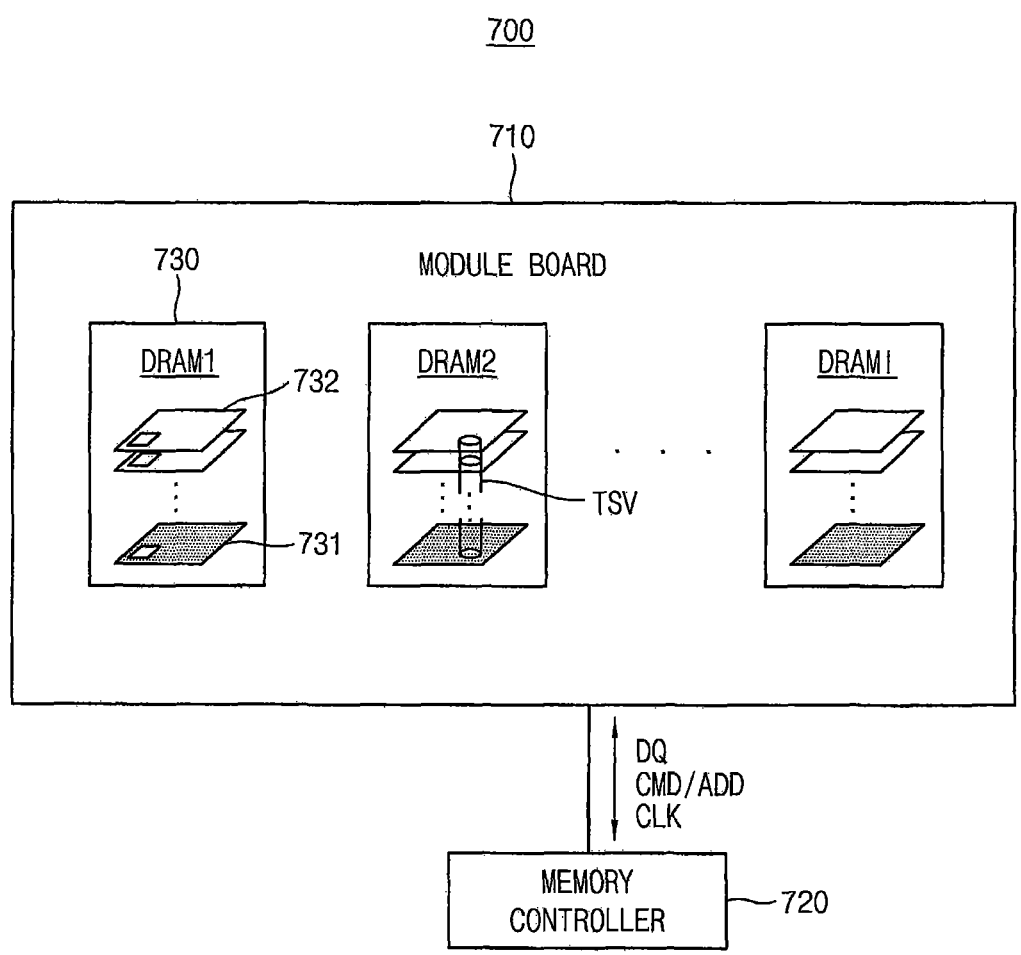
FIG. 14 is a block diagram illustrating a memory system according to example embodiments.

FIG. 14 is a block diagram illustrating a memory system according to example embodiments.

Referring to FIG. 14, a memory system 700 may include a memory module 710 and a memory controller 720. The memory module 710 may include at least one semiconductor memory device 730 mounted on a module substrate. For example, the semiconductor memory device 730 may be a DRAM chip. In some embodiments, the semiconductor memory device 730 may include a plurality of semiconductor dies that are stacked vertically. In some example embodiments, the semiconductor dies may include the master die 731 and the slave dies 732 as described with reference to FIG. 13. In some example embodiments, the semiconductor dies may include the interface die 731 and the memory dies or the slave dies 732. Signal transfer between the semiconductor dies may occur via through-substrate vias (e.g., through-silicon vias) TSVs.

The memory module 710 may communicate with the memory controller 720 via a system bus. Data DQ, command/address CMD/ADD, and a clock signal CLK may be transmitted and received between the memory module 710 and the memory controller 720 via the system bus.

As described above with reference to FIG. 13, at least one semiconductor memory device 730 may include an embedded refresh controller RFCON 10 according to example embodiments. The embedded refresh controller 10 may include a refresh counter and an address generator. The refresh counter may generate a counter refresh address signal in response to a counter refresh signal such that the counter refresh address signal may represent a sequentially changing address. The address generator may store information with respect to a hammer address that is accessed intensively and may generate a hammer refresh address signal in response to a hammer refresh signal such that the hammer refresh address signal may represent an address of a row that is physically adjacent to a row of the hammer address. The embedded refresh controller 10 may reduce or possibly prevent loss of cell data and may enhance performance of the semiconductor memory device 730 by detecting the intensively-accessed hammer address and performing the refresh operation based on the detected hammer address efficiently.

Figure 15:
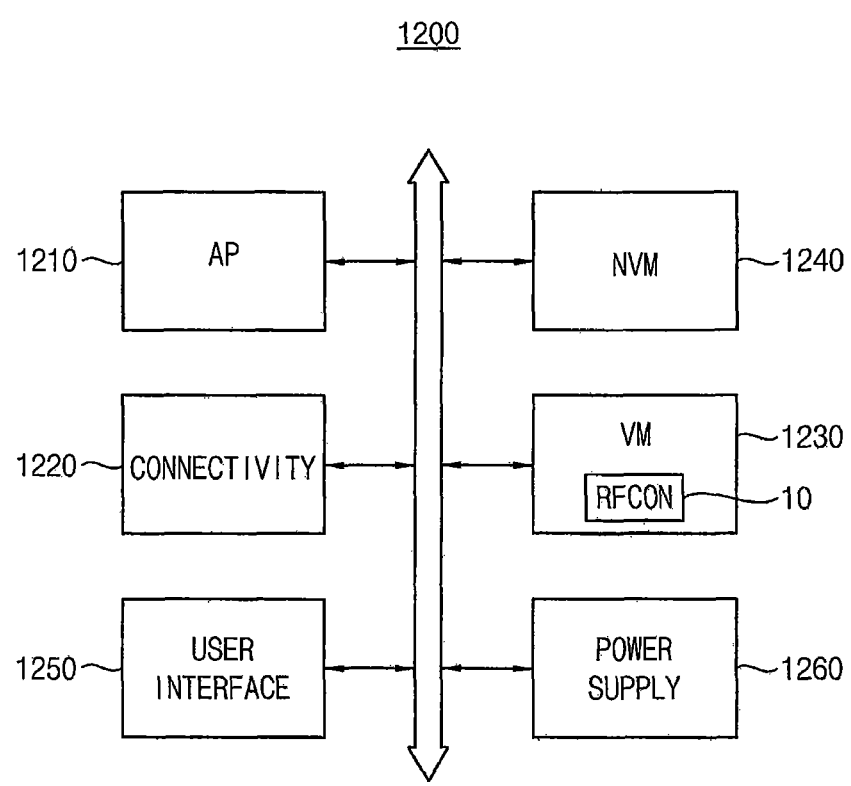
FIG. 15 is a block diagram illustrating a mobile system according to example embodiments.

FIG. 15 is a block diagram illustrating a mobile system according to example embodiments.

Referring to FIG. 15, a mobile system 1200 includes an application processor (AP) 1210, a connectivity unit 1220, a volatile memory device (VM) 1230, a nonvolatile memory device (NVM) 1240, a user interface 1250, and a power supply 1260. In some embodiments, the mobile system 1200 may be, for example, a mobile phone, a smart phone, a personal digital assistant (PDA), a portable multimedia player (PMP), a digital camera, a music player, a portable game console, a navigation system, or another type of electronic device.

The application processor 1210 may execute applications such as a web browser, a game application, a video player, etc. In some embodiments, the application processor 1210 may include a single core or multiple cores. For example, the application processor 1210 may be a multi-core processor such as a dual-core processor, a quad-core processor, a hexa-core processor, etc. The application processor 1210 may include an internal or external cache memory.

The connectivity unit 1220 may perform wired or wireless communication with an external device. For example, the connectivity unit 1220 may perform Ethernet communication, near field communication (NFC), radio frequency identification (RFID) communication, mobile telecommunication, memory card communication, universal serial bus (USB) communication, etc. In some embodiments, connectivity unit 1220 may include a baseband chipset that supports communications, such as global system for mobile communications (GSM), general packet radio service (GPRS), wideband code division multiple access (WCDMA), high speed downlink/uplink packet access (HSxPA), etc.

The volatile memory device 1230 may store data processed by the application processor 1210 or may operate as a working memory. For example, the volatile memory device 1230 may be a dynamic random access memory, such as DDR SDRAM, LPDDR SDRAM, GDDR SDRAM, RDRAM, etc. The volatile memory device 1230 may include an embedded refresh controller RFCON 10 according to example embodiments. As described above, the embedded refresh controller 10 may include a refresh counter and an address generator. The refresh counter may generate a counter refresh address signal in response to a counter refresh signal such that the counter refresh address signal may represent a sequentially changing address. The address generator may store information with respect to a hammer address that is accessed intensively and may generate a hammer refresh address signal in response to a hammer refresh signal such that the hammer refresh address signal may represent an address of a row that is physically adjacent to a row of the hammer address. The embedded refresh controller 10 may reduce or possibly prevent loss of cell data and enhance performance of the volatile memory device 1230 by detecting the intensively-accessed hammer address and performing the refresh operation based on the detected hammer address efficiently.

The nonvolatile memory device 1240 may store a boot image for booting the mobile system 1200. For example, the nonvolatile memory device 1240 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 1250 may include at least one input device, such as a keypad, a touch screen, etc., and at least one output device, such as a speaker, a display device, etc. The power supply 1260 may supply a power supply voltage to the mobile system 1200. In some embodiments, the mobile system 1200 may further include a camera image processor (CIS), and/or a storage device, such as a memory card, a solid state drive (SSD), a hard disk drive (HDD), a CD-ROM, etc.

In some embodiments, the mobile system 1200 and/or components of the mobile system 1200 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi-chip package (MCP), wafer-level fabricated package (WFP), wafer-level processed stack package (WSP), etc.

Figure 16:
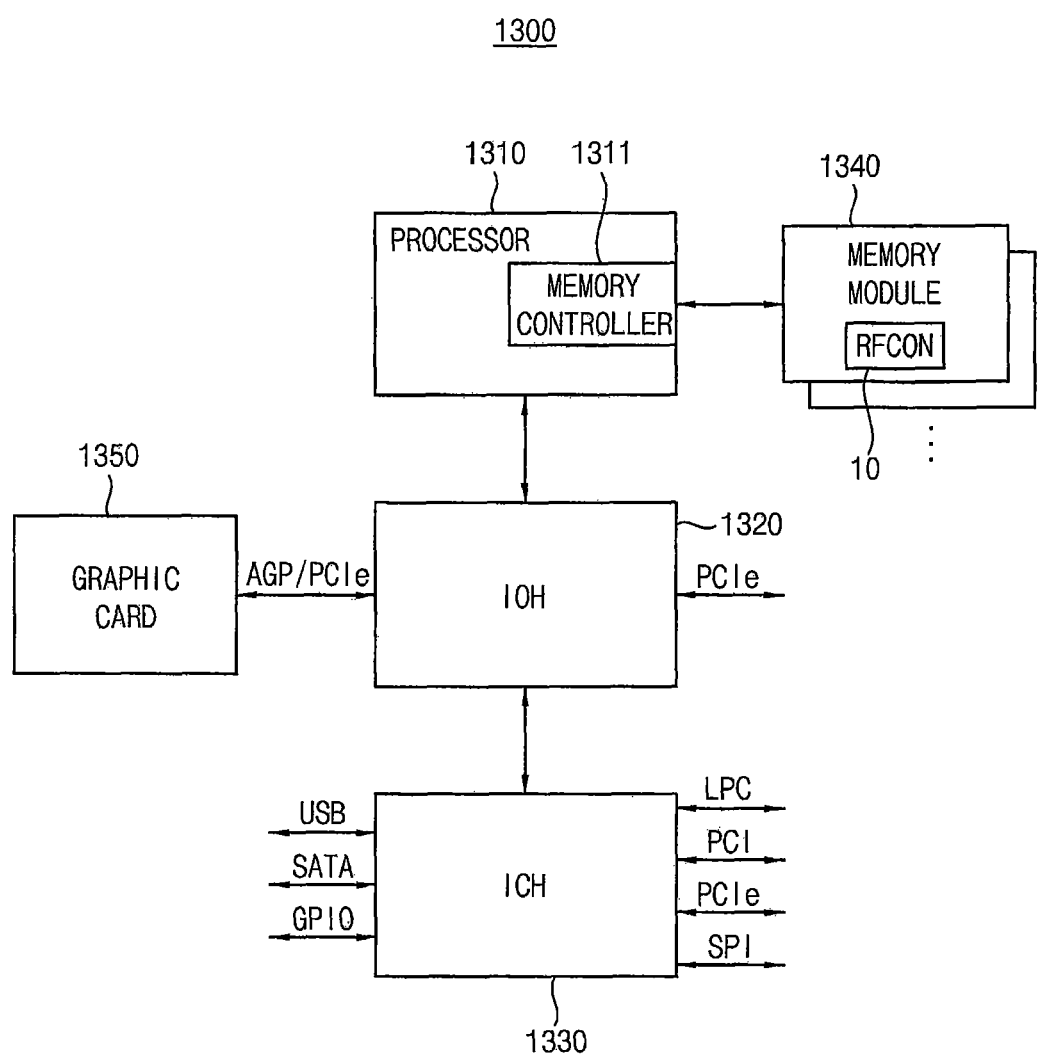
FIG. 16 is a block diagram illustrating a computing system according to example embodiments.

FIG. 16 is a block diagram illustrating a computing system according to example embodiments.

Referring to FIG. 16, a computing system 1300 includes a processor 1310, an input/output hub (IOH) 1320, an input/output controller hub (ICH) 1330, at least one memory module 1340, and a graphics card 1350. In some embodiments, the computing system 1300 may be a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 1310 may perform various computing functions such as executing specific software for performing specific calculations or tasks. For example, the processor 1310 may be a microprocessor, a central process unit (CPU), a digital signal processor, or the like. In some embodiments, the processor 1310 may include a single core or multiple cores. For example, the processor 1310 may be a multi-core processor, such as a dual-core processor, a quad-core processor, a hexa-core processor, etc. Although FIG. 16 illustrates the computing system 1300 including one processor 1310, in some embodiments, the computing system 1300 may include a plurality of processors. The processor 1310 may include an internal or external cache memory.

The processor 1310 may include a memory controller 1311 for controlling operations of the memory module 1340. The memory controller 1311 included in the processor 1310 may be referred to as an integrated memory controller (IMC). A memory interface between the memory controller 1311 and the memory module 1340 may be implemented with a single channel including a plurality of signal lines, or may be implemented with multiple channels, to each of which at least one memory module 1340 may be coupled. In some embodiments, the memory controller 1311 may be located inside the input/output hub 1320, which may be referred to as memory controller hub (MCH).

The memory module 1340 may include a plurality of memory devices that store data provided from the memory controller 1311 and the memory device may include an embedded refresh controller RFCON 10 according to example embodiments. As described above, the embedded refresh controller 10 may include a refresh counter and an address generator. The refresh counter may generate a counter refresh address signal in response to a counter refresh signal such that the counter refresh address signal may represent a sequentially changing address. The address generator may store information with respect to a hammer address that is accessed intensively and may generate a hammer refresh address signal in response to a hammer refresh signal such that the hammer refresh address signal may represent an address of a row that is physically adjacent to a row of the hammer address. The embedded refresh controller 10 may reduce or possibly prevent loss of cell data and enhance performance of the memory device by detecting the intensively-accessed hammer address and performing the refresh operation based on the detected hammer address efficiently.

The input/output hub 1320 may manage data transfer between processor 1310 and devices, such as the graphics card 1350. The input/output hub 1320 may be coupled to the processor 1310 via various interfaces. For example, the interface between the processor 1310 and the input/output hub 1320 may be a front side bus (FSB), a system bus, a HyperTransport, a lightning data transport (LDT), a QuickPath interconnect (QPI), a common system interface (CSI), etc. Although FIG. 16 illustrates the computing system 1300 including one input/output hub 1320, in some embodiments, the computing system 1300 may include a plurality of input/output hubs. The input/output hub 1320 may provide various interfaces with the devices. For example, the input/output hub 1320 may provide an accelerated graphics port (AGF) interface, a peripheral component interface-express (PCIe), a communications streaming architecture (CSA) interface, etc.

The graphic card 1350 may be coupled to the input/output hub 1320 via AGP or PCIe. The graphics card 1350 may control a display device (not shown) for displaying an image. The graphics card 1350 may include an internal processor for processing image data and an internal memory device. In some embodiments, the input/output hub 1320 may include an internal graphics device along with or instead of the graphics card 1350 outside the graphics card 1350. The graphics device included in the input/output hub 1320 may be referred to as integrated graphics. Further, the input/output hub 1320 including the internal memory controller and the internal graphics device may be referred to as a graphics and memory controller hub (GMCH).

The input/output controller hub 1330 may perform data buffering and interface arbitration to efficiently operate various system interfaces. The input/output controller hub 1330 may be coupled to the input/output hub 1320 via an internal bus, such as a direct media interface (DMI), a hub interface, an enterprise Southbridge interface (ESI), PCIe, etc. The input/output controller hub 1330 may provide various interfaces with peripheral devices. For example, the input/output controller hub 1330 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1310, the input/output hub 1320 and the input/output controller hub 1330 may be implemented as separate chipsets or separate integrated units. In some embodiments, at least two of the processor 1310, the input/output hub 1320 and the input/output controller hub 1330 may be implemented as a single chipset. Also, while many features of the embodiments are disclosed as units, in some embodiments those features may be implemented as other forms of logic including but not limited to code-based operations performed by a processor.

As such, embedded refresh controllers and memory devices including the embedded refresh controllers according to example embodiments may reduce or possibly prevent loss of cell data and may enhance performance of the memory device by detecting the intensively-accessed hammer address and performing the refresh operation based on the detected hammer address efficiently. In addition, the embedded refresh controllers and the memory devices including the embedded refresh controllers according to example embodiments may use the established interface between the memory devices and the memory controllers and may support refresh operation based on a hammer address without excessive design change since the embedded refresh controller is implemented in the memory device.

The present inventive concept may be applied to any devices and systems including a memory device requiring a refresh operation. For example, the present inventive concept may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the present inventive concept. Accordingly, all such modifications are intended to be included within the scope of the present inventive concept as defined in the claims. Thus, to the maximum extent allowed by law, the scope is to be determined by the broadest permissible interpretation of the following claims and their equivalents, and shall not be restricted or limited by the foregoing detailed description.

What is claimed is:

1. An embedded refresh controller included in a memory device, the embedded refresh controller comprising:
   a refresh counter configured to generate a counter refresh address signal in response to a counter refresh signal, the counter refresh address signal corresponding to a row address of the memory device; and
   an address generator configured to store information with respect to a hammer address that is accessed intensively and configured to generate a hammer refresh address signal in response to a hammer refresh signal, the hammer refresh address signal corresponding to an address of a first row of the memory device that is physically adjacent to a second row of the memory device corresponding to the hammer address,
   wherein the address generator includes a storage circuit configured to store row addresses of the memory device and respective access count values corresponding to the row addresses in response to an active signal and an address signal provided from a memory controller,
   wherein each of the access count values represents a number of occurrence of access to a respective row among a plurality of rows of the memory device,
   wherein the address generator is configured to determine the hammer address as an address of one of the plurality of rows having a highest access count value among the access count values stored in the storage circuit when the hammer refresh signal is activated, and
   wherein the address generator is configured to initialize the highest access count value and a lowest access count value among the access count values stored in the storage circuit to zero without changing remaining access count values after determining the hammer address.

2. The embedded refresh controller of claim 1, wherein the address generator is configured to accumulate the access count values without initializing the access count values stored in the storage circuit in each of a plurality of time frames.

3. The embedded refresh controller of claim 1, wherein the storage circuit includes a plurality of storage units, and each of the storage units is configured to store a respective one of the row addresses and a respective one of the access count values.

4. The embedded refresh controller of claim 3, wherein the address generator is configured to replace an address of a new row with an address of one of the plurality of rows corresponding to the lowest access count value among the access count values stored in the storage circuit when all of the storage units store the row addresses and the new row that corresponds to the address not stored in the storage units is accessed.

5. The embedded refresh controller of claim 1, further comprising:
a timing controller configured to generate the counter refresh signal and the hammer refresh signal in response to a refresh signal provided from the memory controller.

6. The embedded refresh controller of claim 5, wherein the timing controller is configured to selectively activate one of the counter refresh signal and the hammer refresh signal.

7. The embedded refresh controller of claim 1, wherein the memory device further comprises an interface, and the memory device is configured to communicate with the memory controller through the interface, and
wherein the embedded refresh controller is configured to generate the hammer refresh signal in response to a command signal provided by the memory controller through the interface.

8. A memory device comprising:
an interface, the memory device being configured to communicate with a memory controller through the interface;
a memory cell array including a plurality of memory cells; and
an embedded refresh controller configured to control a refresh operation of the memory cells, the embedded refresh controller comprising:
a refresh counter configured to generate a counter refresh address signal in response to a counter refresh signal, the counter refresh address signal corresponding to a row address of the memory cell array; and
an address generator configured to store information with respect to a hammer address that is accessed intensively and configured to generate a hammer refresh address signal in response to a hammer refresh signal, the hammer refresh address signal corresponding to an address of a first row of the memory cell array that is physically adjacent to a second row of the memory cell array corresponding to the hammer address, and the embedded refresh controller being configured to generate the hammer refresh signal in response to a command signal provided by the memory controller through the interface,
wherein the embedded refresh controller is further configured to periodically generate the counter refresh signal for a first number of first activation periods and then periodically generate the hammer refresh signal for a second number of second activation periods, and
wherein the embedded refresh controller is further configured to maintain an activation ratio between the first number of first activation periods and the second number of second activation periods.

9. The memory device of claim 8, wherein the memory cell array includes a plurality of memory banks, and
wherein the address generator includes a plurality of sub-generators, and each of the sub-generators is configured to independently generate hammer refresh address signals corresponding to each of the memory banks.

10. The memory device of claim 9, wherein first ones of the memory cells included in rows that have addresses corresponding to the counter refresh address signal are configured to be refreshed simultaneously in all of the memory banks when the counter refresh signal is activated, and
wherein second ones of the memory cells included in rows that have addresses corresponding to the hammer refresh address signals of the respective memory banks are configured to be refreshed simultaneously in all of the memory banks when the hammer refresh signal is activated.

11. The memory device of claim 8, wherein the memory device is a three-dimensional memory device including a plurality of semiconductor dies that are stacked vertically.

12. The memory device of claim 8, wherein the interface comprises an address pad and a data pad.

13. The memory device of claim 8, wherein the memory device is configured to receive a Row Address Strobe (RAS) signal and a Column Address Strobe (CAS) signal from the memory controller through the interface.

14. A memory device comprising:
an embedded refresh controller comprising an address generator that is configured to store addresses of rows and numbers of occurrence of access to the respective rows and is configured to determine a hammer address as an address of one of the rows that has a highest number of occurrence of access in response to a hammer refresh signal that is activated in synchronization with time points at a periodic interval; and
wherein the embedded refresh controller further comprises:
a timing controller configured to generate a counter refresh signal and the hammer refresh signal in response to a refresh signal provided from a memory controller,
wherein the embedded refresh controller is configured to generate the counter refresh signal for a first number of first activation periods and then generate the hammer refresh signal for a second number of second activation periods, and
wherein the embedded refresh controller is further configured to maintain an activation ratio between the first number of first activation periods and the second number of second activation periods.

15. The memory device of claim 14, wherein the address generator is configured to initialize the number of occurrence of access of the one of the rows that has the highest number of occurrence of access without changing at least one of the numbers of occurrence of access after determining the hammer address.

16. The memory device of claim 15, wherein the address generator is configured to initialize the address of the one of the rows that has the highest number of occurrence of access after determining the hammer address.

17. The memory device of claim 15, wherein the address generator is configured to initialize the number of occurrence of access of one of the rows that has a lowest number of occurrence of access without changing remaining number of occurrence of access after determining the hammer address.

18. The memory device of claim 14, wherein a memory cell array including the rows and the embedded refresh controller are in one die.

* * * * *